US009368207B2

(12) United States Patent
Bandyopadhyay et al.

(10) Patent No.: US 9,368,207 B2
(45) Date of Patent: *Jun. 14, 2016

(54) METHOD OF OPERATING FET LOW CURRENT 3D RE-RAM

(71) Applicant: SanDisk 3D LLC, Milpitas, CA (US)

(72) Inventors: Abhijit Bandyopadhyay, San Jose, CA (US); Roy E Scheuerlein, Cupertino, CA (US); Chandrasekhar R Gorla, Cupertino, CA (US); Brian Le, San Jose, CA (US)

(73) Assignee: SanDisk Technologies Inc., Plano, TX (US)

( * ) Notice: Subject to any disclaimer, the term of this patent is extended or adjusted under 35 U.S.C. 154(b) by 0 days.

This patent is subject to a terminal disclaimer.

(21) Appl. No.: 14/591,546

(22) Filed: Jan. 7, 2015

(65) Prior Publication Data
US 2015/0170742 A1    Jun. 18, 2015

Related U.S. Application Data

(62) Division of application No. 14/025,442, filed on Sep. 12, 2013, now Pat. No. 8,995,169.

(51) Int. Cl.
*G11C 13/00*   (2006.01)
*G11C 11/56*   (2006.01)
(Continued)

(52) U.S. Cl.
CPC ........ *G11C 13/0069* (2013.01); *G11C 11/5614* (2013.01); *G11C 11/5678* (2013.01); *G11C 13/0002* (2013.01); *G11C 13/003* (2013.01); *G11C 13/0004* (2013.01); *G11C 13/0007* (2013.01); *G11C 16/3454* (2013.01); *G11C 7/00* (2013.01); *G11C 2013/0083* (2013.01);
(Continued)

(58) Field of Classification Search
CPC .......... G11C 13/0069; G11C 13/0002; G11C 13/003; G11C 7/00
USPC .......................................... 365/148, 158, 163
See application file for complete search history.

(56) References Cited

U.S. PATENT DOCUMENTS

| 6,034,882 A | 3/2000 | Johnson et al. |
| 6,567,287 B2 | 5/2003 | Scheuerlein |
| 6,661,730 B1 | 12/2003 | Scheuerlein et al. |

(Continued)

OTHER PUBLICATIONS

Non-final Office Action dated Jan. 15, 2015, U.S. Appl. No. 14/025,420, filed Sep. 12, 2013.

(Continued)

*Primary Examiner* — Ly D Pham
(74) *Attorney, Agent, or Firm* — Vierra Magen Marcus LLP

(57) ABSTRACT

Operating ReRAM memory is disclosed herein. The memory cells may be trained prior to initially programming them. The training may help to establish a percolation path. In some aspects, a transistor limits current of the memory cell when training and programming. A higher current limit is used during training, which conditions the memory cell for better programming. The non-memory may be operated in unipolar mode. The memory cells can store multiple bits per memory cell. A memory cell can be SET directly from its present state to one at least two data states away. A memory cell can be RESET directly to the state having the next highest resistance. Program conditions, such as pulse width and/or magnitude, may depend on the state to which the memory cell is being SET. A higher energy can be used for programming higher current states.

22 Claims, 19 Drawing Sheets

(51) Int. Cl.
*G11C 7/00* (2006.01)
*G11C 16/34* (2006.01)

(52) U.S. Cl.
CPC ........ *G11C2213/71* (2013.01); *G11C 2213/78* (2013.01); *G11C 2213/79* (2013.01)

(56) References Cited

U.S. PATENT DOCUMENTS

| | | | |
|---|---|---|---|
| 6,724,665 | B2 | 4/2004 | Scheuerlein et al. |
| 6,735,104 | B2 | 5/2004 | Scheuerlein |
| 6,765,813 | B2 | 7/2004 | Scheuerlein et al. |
| 7,626,858 | B2 * | 12/2009 | Happ ................. G11C 11/5678 365/148 |
| 7,733,685 | B2 | 6/2010 | Scheuerlein et al. |
| 7,869,258 | B2 | 1/2011 | Scheuerlein et al. |
| 7,961,494 | B2 | 6/2011 | Scheuerlein |
| 7,978,507 | B2 | 7/2011 | Scheuerlein |
| 8,027,209 | B2 | 9/2011 | Yan et al. |
| 8,045,361 | B2 * | 10/2011 | Lee ......................... G11C 11/16 365/148 |
| 8,059,447 | B2 | 11/2011 | Scheuerlein et al. |
| 8,098,511 | B2 | 1/2012 | Scheuerlein et al. |
| 8,111,539 | B2 | 2/2012 | Fasoli et al. |
| 8,238,174 | B2 | 8/2012 | Yan et al. |
| 8,310,892 | B2 | 11/2012 | Scheuerlein et al. |
| 2006/0220071 | A1 | 10/2006 | Kang et al. |
| 2007/0252219 | A1 | 11/2007 | Taguchi |
| 2008/0080228 | A1 * | 4/2008 | Nirschl ................. G11C 11/56 365/148 |
| 2008/0180989 | A1 * | 7/2008 | Baek .................. G11C 11/5607 365/158 |
| 2008/0192529 | A1 * | 8/2008 | Hoenigschmid ... G11C 13/0004 365/148 |
| 2008/0225567 | A1 | 9/2008 | Burr et al. |
| 2009/0154227 | A1 | 6/2009 | Philipp et al. |
| 2009/0290412 | A1 * | 11/2009 | Mouli ................. G11C 11/5664 365/163 |
| 2010/0254177 | A1 * | 10/2010 | Scheuerlein ....... G11C 13/0007 365/148 |
| 2011/0205782 | A1 | 8/2011 | Costa et al. |
| 2012/0127779 | A1 | 5/2012 | Scheuerlein et al. |
| 2012/0147644 | A1 | 6/2012 | Scheuerlein |
| 2012/0147645 | A1 | 6/2012 | Scheuerlein |
| 2012/0147646 | A1 | 6/2012 | Scheuerlein |
| 2012/0147647 | A1 | 6/2012 | Scheuerlein |
| 2012/0147648 | A1 | 6/2012 | Scheuerlein |
| 2012/0147651 | A1 | 6/2012 | Scheuerlein et al. |
| 2012/0147652 | A1 | 6/2012 | Scheuerlein |
| 2012/0147689 | A1 | 6/2012 | Scheuerlein et al. |
| 2012/0170364 | A1 * | 7/2012 | Jang .................... G11C 11/5628 365/185.03 |
| 2012/0236624 | A1 | 9/2012 | Costa et al. |
| 2013/0148404 | A1 * | 6/2013 | Bandyopadhyay  G11C 11/5692 365/103 |
| 2013/0163320 | A1 | 6/2013 | Lam et al. |
| 2013/0163322 | A1 | 6/2013 | Lam et al. |

OTHER PUBLICATIONS

U.S. Appl. No. 14/025,420, filed Sep. 12, 2013.
U.S. Appl. No. 14/025,442, filed Sep. 12, 2013.
International Search Report & The Written Opinion of the International Searching Authority dated Dec. 2, 2014, International Application No. PCT/US2014/054864.
Restriction Requirement dated Nov. 26, 2014, U.S. Appl. No. 14/025,420, filed Sep. 12, 2013.
Response to Restriction Requirement dated Dec. 18, 2014, U.S. Appl. No. 14/025,420, filed Sep. 12, 2013.
Notice of Allowance dated Nov. 21, 2014, U.S. Appl. No. 14/025,442, filed Sep. 12, 2013.

* cited by examiner

US 9,368,207 B2

METHOD OF OPERATING FET LOW CURRENT 3D RE-RAM

CLAIM OF PRIORITY

This application is a divisional application of U.S. patent application Ser. No. 14/025,442, entitled "METHOD OF OPERATING FET LOW CURRENT 3D RE-RAM," by Bandyopadhyay et al., filed Sep. 12, 2013, published as US 2015/0070966 on Mar. 12, 2015 and issued as U.S. Pat. No. 8,995,169 on Mar. 31, 2015, incorporated by reference herein in its entirety.

BACKGROUND

1. Field

This application relates to technology for non-volatile data storage.

2. Description of the Related Art

A variety of materials show reversible resistivity-switching behavior, and as such may be suitable as use for memory elements. One type of material having reversible resistivity-switching behavior is referred to as resistance change memory (ReRAM). Transition metal oxides have been proposed for ReRAM. Upon application of sufficient voltage, current, or other stimulus, the reversible resistivity-switching material switches to a stable low-resistance state, which is sometimes referred to as SETTING the device. This resistivity-switching is reversible such that subsequent application of an appropriate voltage, current, or other stimulus can serve to return the reversible resistivity-switching material to a stable high-resistance state, which is sometimes referred to as RESETTING the device. This conversion can be repeated many times. The low resistance state is sometimes referred to as an "on" state. The high resistance state is sometimes referred to as an "off" state. For some switching materials, the initial state is low-resistance rather than high-resistance.

DETAILED DESCRIPTION

Figure 1A:
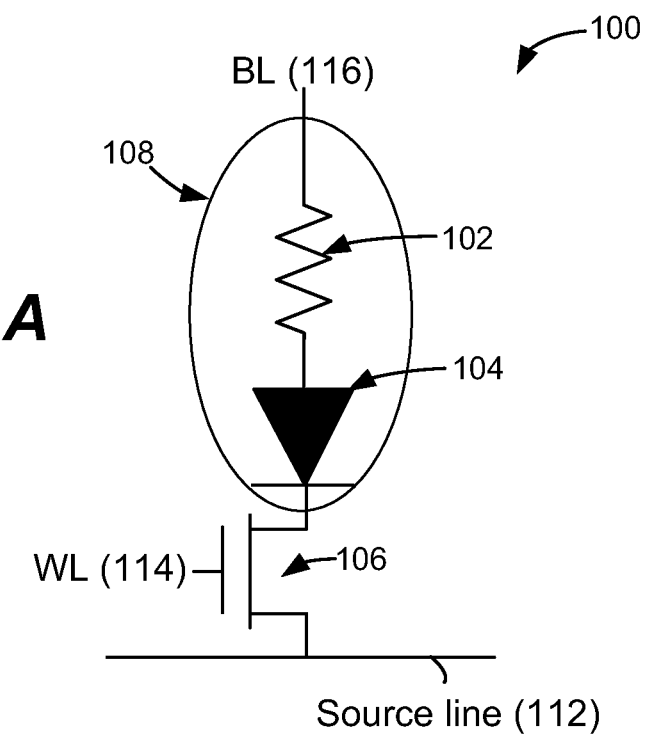
FIG. 1A is a diagram of one embodiment of a memory cell unit in which there is a single memory cell in the memory cell unit.

The technology described herein is directed to non-volatile storage devices having reversible resistance storage elements, and methods for operating the same. In one embodiment, a memory cell unit includes one or more memory cells and a transistor (e.g., FET) that is used to control (e.g., limit) current of the memory cells. The memory cells have a reversible resistance storage element and a non-linear element in series with the reversible resistance storage element, in one embodiment. Examples of the non-linear element include, but are not limited to, diodes and tunneling dielectrics (e.g., barrier height tunneling dielectric). Examples of diodes for the memory cell include, but are not limited to, punch though diode, tunnel diode, carbon diodes, oxide diode etc.

In one embodiment, the drain of the transistor is connected to a first end of the memory cell. If the memory cell unit has multiple memory cells then the drain may be connected to a node that is common to a first end of each of the memory cells. The source of the transistor is connected to a common source line. The common source line may be grounded during operation. The source node of transistors in many (in some cases all) different memory cell units connects to the common source line. The gate of the transistor may be connected to a word line. The same word line may connect to the transistor gate of several (or many) different memory cell units. A second end of the memory cell is connected to a bit line. Different memory cells in the same memory cell unit are connected to different bit lines. Therefore, the bit lines are able to provide different data to the different memory cells, as well as to be used to read the different memory cells individually, in embodiments.

In one embodiment, the non-volatile storage device is operated in unipolar mode. Unipolar mode refers to using the same polarity voltage to SET (e.g., decrease resistance) and RESET (e.g. increase resistance) the memory cell. Unipolar is in contrast to bi-polar mode in which opposite polarity voltages are used to set and reset the memory cells. One benefit of unipolar mode is that it can be less stressful on the memory cells than bipolar mode. For example, some architectures have a steering element (e.g., diode) in series with the reversible resistance storage element. The steering element can help to reduce (or prevent) leakage current associated with unselected memory cells. Bipolar mode can potentially damage the steering element. As one example, repeated reverse biasing of a diode can damage it. However, unipolar mode does not need to reverse bias any steering elements, such as diodes. Therefore, a diode can be used in the memory cell in series with the reversible resistance storage element to reduce (or prevent) leakage current of unselected cells. Note that a diode is one example of a non-linear element that can be used in the memory cell in series with the reversible resistance storage element to reduce (or prevent) leakage current of unselected cells. Another example is a tunneling dielectric. Other devices may be used for the non-linear element that is in series with the reversible resistance storage element.

In one embodiment, the memory cells are trained prior to initially programming them. The training may help to establish a percolation path, at least for some materials used for the reversible resistance storage element. The training may include cycling the memory cells between a lower target resistance and a higher target resistance for some target number of cycles. The memory cell is allowed only a certain number of training pulses (e.g., voltage pulses) to reach each of the target resistances, in one embodiment. If the memory cell fails to reach the target resistance within the allowed number of training pulses, then the training fails for this attempt. The training can be repeated until the memory cell passes. That is, training can be repeated until the memory cell successfully cycles between the lower and higher target resistances for the target number of cycles.

When training the memory cells, a voltage is applied to the gate of the transistor to control (e.g., limit) the current through the memory cell. This voltage may be higher than the voltage used during regular programming, such that more current is allowed for the memory cell during training than during programming. The higher current during training may condition the memory cell such that it is easier for conductive paths to form when setting the memory cell.

The memory cells store multiple bits per memory cell, in one embodiment. For example, each reversible resistance storage element could be programmed to one of four different resistance ranges to provide for two bits per memory cell. In one embodiment, programming may be from any state to any state. As one example, the four states are referred to as states 0, 1, 2, and 3. A memory cell can be programmed (e.g., SET) directly from state 0 to any of the other states, in one embodiment.

In one embodiment, a memory cell can be RESET directly to the state having the next highest resistance. For example, the memory cell can reset directly from state 3 to state 2. This is in contrast to techniques that RESET the memory cell all the way to the highest resistance state, and then SET the memory cell to the target state. For example, some conventional techniques may reset the memory cell from state 3 all the way to state 0 (highest resistance state). Then, the memory cell is set from state 0 to state 2.

In one embodiment, the group of programming conditions includes a voltage magnitude and a voltage pulse width. The programming voltage may be applied to the bit line, while a control voltage is applied between the gate and source of the transistor to control current through the memory cell. The programming voltage magnitude and programming voltage pulse width may be related to energy provided to the memory cell. The amount of energy is increased for higher states when setting, in one embodiment. Higher states refers to states associated with lower resistances in this example. The initial programming voltage during reset depends on the present state of the memory cell, in one embodiment.

FIG. 1A is a diagram of one embodiment of a memory cell unit 100 in which there is a single memory cell 108 in the memory cell unit 100. The memory cell unit 100 includes a reversible resistance storage element 102, a non-linear element 104, and a transistor 106. The memory cell 108 comprises the reversible resistance storage element 102 and the non-linear element 104 in this embodiment. One end of the memory cell 108 is connected to a bit line (BL) 116. The other end of the memory cell 108 is connected to the transistor 106. These connections may be direct or indirect. Thus, there may be other elements (not depicted in FIG. 1A) between the memory cell 108 and the BL. Likewise, there may be other elements (not depicted in FIG. 1A) between the memory cell 108 and transistor 106. As depicted in FIG. 1A, the transistor 106 has three nodes, which may be a drain, gate, and source. Note that the transistor 106 may also have a body node (not depicted in FIG. 1A). During operation (e.g., forming, set, reset, read) the body node may be grounded. In one embodiment, the body node is connected to the source line 112. The source of the transistor 106 is connected to the source line (112). The gate of the transistor 106 is connected to the word line (WL), in this embodiment. The connections to the source line and word line may be direct or indirect. Note that in this example and throughout this disclosure, a connection between two elements is understood to include both a direct connection (e.g., no intervening elements) and an indirect connection (e.g., one or more intervening elements).

The reversible resistance storage element 102 is such that its resistance (and thus inversely the conductance) may be changed as a result of a voltage placed across the memory cell 108. In some embodiments, a voltage is applied to the bit line, with the source line grounded (or at some other voltage), to change the resistance of the memory cell 108. Thus, a voltage is applied between the bit line and source line, in some embodiments.

Depending on the type of reversible resistance storage element 102, the state may change in response to a voltage across it, a level of current though it, an amount of electric field across it, etc. Application of external energy (e.g., voltage, current, etc.) may generate heat, which may impact the state. With some variable resistive element materials, it is the amount of time that the voltage, current, electric field, and the like is applied to the element that determines when its conductive state changes and the direction in which the change takes place. In between such state changing operations, the resistance of the memory cell 108 remains unchanged, so is non-volatile. The memory cell 108 may be implemented with a reversible resistance storage element 102 selected from a wide variety of such materials having different properties and operating characteristics.

In some embodiments, reversible resistance storage element 102 includes a region formed from a metal oxide. Various different metal oxides can be used. The metal-oxide may a transition metal-oxide. Examples of metal-oxides include, but are not limited to, NiO, $Nb_2O_5$, $TiO_2$, $HfO_2$, $Al_2O_3$, $MgO_x$, $CrO_2$, VO, BN, and AlN.

Another class of materials suitable for use in the reversible resistance storage element 102 is solid electrolytes but since they are electrically conductive when deposited, individual memory elements need to be formed and isolated from one another. Solid electrolytes are somewhat similar to the metal oxides, and the conduction mechanism is assumed to be the formation of a metallic filament between the top and bottom electrode. In this structure the filament is formed by dissolving ions from one electrode (the oxidizable electrode) into the body of the cell (the solid electrolyte). In one example, the solid electrolyte contains silver ions or copper ions, and the oxidizable electrode is preferably a metal intercalated in a transition metal sulfide or selenide material such as $A_x(MB2)_{1-x}$, where A is Ag or Cu, B is S or Se, and M is a transition metal such as Ta, V, or Ti, and x ranges from about 0.1 to about 0.7. Such a composition minimizes oxidizing unwanted material into the solid electrolyte. One example of such a composition is $Ag_x(TaS2)_{1-x}$. Alternate composition materials include α-AgI. The other electrode (the indifferent or neutral electrode) should be a good electrical conductor while remaining insoluble in the solid electrolyte material. Examples include metals and compounds such as W, Ni, Mo, Pt, metal silicides, and the like.

Examples of solid electrolytes materials are: TaO, GeSe or GeS. Other systems suitable for use as solid electrolyte cells are: Cu/TaO/W, Ag/GeSe/W, Cu/GeSe/W, Cu/GeS/W, and Ag/GeS/W, where the first material is the oxidizable electrode, the middle material is the solid electrolyte, and the third material is the indifferent (neutral) electrode. Typical thicknesses of the solid electrolyte are between 30 nm and 100 nm.

In recent years, carbon has been extensively studied as a non-volatile memory material. As a non-volatile memory element, carbon is usually used in two forms, conductive (or grapheme like-carbon) and insulating (or amorphous carbon). The difference in the two types of carbon material is the content of the carbon chemical bonds, so called $sp^2$ and $sp^3$ hybridizations. In the $sp^3$ configuration, the carbon valence electrons are kept in strong covalent bonds and as a result the $sp^3$ hybridization is non-conductive. Carbon films in which the $sp^3$ configuration dominates are commonly referred to as tetrahedral-amorphous carbon, or diamond like. In the $sp^2$ configuration, not all the carbon valence electrons are kept in covalent bonds. The weak tight electrons (phi bonds) contribute to the electrical conduction making the mostly $sp^2$ configuration a conductive carbon material. The operation of the carbon resistive switching nonvolatile memories is based on the fact that it is possible to transform the $sp^3$ configuration to the $sp^2$ configuration by applying appropriate current (or voltage) pulses to the carbon structure. For example, when a very short (1-5 ns) high amplitude voltage pulse is applied across the material, the conductance is greatly reduced as the material $sp^2$ changes into an $sp^3$ form ("reset" state). It has been theorized that the high local temperatures generated by this pulse causes disorder in the material and if the pulse is very short, the carbon "quenches" in an amorphous state ($sp^3$ hybridization). On the other hand, when in the reset state, applying a lower voltage for a longer time (~300 nsec) causes part of the material to change into the $sp^2$ form ("set" state). The carbon resistance switching non-volatile memory elements have a capacitor like configuration where the top and bottom electrodes are made of high temperature melting point metals like W, Pd, Pt and TaN.

There has been significant attention recently to the application of carbon nanotubes (CNTs) as a non-volatile memory material. A (single walled) carbon nanotube is a hollow cylinder of carbon, typically a rolled and self-closing sheet one carbon atom thick, with a typical diameter of about 1-2 nm and a length hundreds of times greater. Such nanotubes can demonstrate very high conductivity, and various proposals have been made regarding compatibility with integrated circuit fabrication. It has been proposed to encapsulate "short" CNT's within an inert binder matrix to form a fabric of CNT's. These can be deposited on a silicon wafer using a spin-on or spray coating, and as applied the CNT's have a random orientation with respect to each other. When an electric field is applied across this fabric, the CNT's tend to flex or align themselves such that the conductivity of the fabric is changed. As in the other carbon based resistive switching non-volatile memories, the CNT based memories have capacitor-like configurations with top and bottom electrodes made of high melting point metals such as those mentioned above.

Yet another class of materials suitable for use in the reversible resistance storage element 102 is phase-change materials. A preferred group of phase-change materials includes chalcogenide glasses, often of a composition $Ge_xSb_yTe_z$, where preferably x=2, y=2 and z=5. GeSb has also been found to be useful. Other materials include AgInSbTe, GeTe, GaSb, BaSbTe, InSbTe and various other combinations of these basic elements. Thicknesses are generally in the range of 1 nm to 500 nm. The generally accepted explanation for the switching mechanism is that when a high energy pulse is applied for a very short time to cause a region of the material to melt, the material "quenches" in an amorphous state, which is a low conductive state. When a lower energy pulse is applied for a longer time such that the temperature remains above the crystallization temperature but below the melting temperature, the material crystallizes to form poly-crystal phases of high conductivity. These devices are often fabricated using sub-lithographic pillars, integrated with heater electrodes. Often the localized region undergoing the phase change may be designed to correspond to a transition over a step edge, or a region where the material crosses over a slot etched in a low thermal conductivity material. The contacting electrodes may be any high melting metal such as TiN, W, WN and TaN in thicknesses from 1 nm to 500 nm.

The resistance of the reversible resistance storage element 102, and thus its detectable storage state, can be repetitively set from an initial level to another level and then re-set back to the initial level. For some materials, the amount or duration of the voltage, current, electric field, and the like applied to change its state in one direction is different (asymmetrical) with that applied to change in another direction. With two detectable states, each memory element stores one-bit of data. With the use of some materials, more than one bit of data may be stored in each memory element by designating more than two stable levels of resistance as detectable states of the memory element. Thus, more than two resistance levels, or ranges of resistance, (e.g., four ranges, eight ranges) could be used.

The non-linear element 104 is electrically in series with the reversible resistance storage element 102. The relative positions of the reversible resistance storage element 102 and the non-linear element 104 may be reversed relative to what is depicted in FIG. 1A. For example, the relative order could be bit line, non-linear element 104, reversible resistance storage element 102, transistor 106, and source line, instead. Note that other elements, such as electrodes, barrier layers, adhesions layers, etc., could also be included in the memory cell unit 100, but are not depicted in FIG. 1A.

In one embodiment, non-linear element 104 is a diode. Note that although a diode symbol is used to represent the non-linear element 104, it will be understood that the symbol represents a non-linear element and is not limited to a diode. A variety of types and structures can be used for the diode. The diode non-linear element 104 may be a p-i-n diode. In one embodiment, a p-i-n diode includes a p-doped region, an intrinsic region, and an n-doped region. In one embodiment, the diode non-linear element 104 is a punch-thru diode. A punch-thru diode used as a steering element may be may be a N+/P−/N+ device or a P+/N−/P+ device. In one embodiment, the diode non-linear element 104 is a Schottky diode. In one embodiment, the diode non-linear element 104 is a back-to-back Schottky diode. Another non-linear back-to-back structure that could be used is a MIM (metal-insulator-metal) diode. In one embodiment, the MIM diode is an oxide based MIM diode, where the insulator could be $Al_2O_3$, $Ta_2O_5$, SiN, etc. An example metal for the MIM diode is TiN, TaN, WN or like. In one embodiment, the non-linear element 104 is a MIIM (Metal-Insulator-Insulator-Metal) diode. One example of the two insulators in the MIIM diode is $Al_2O_3$ and $Ta_2O_5$. Another example of the two insulators in the MIIM diode is $Ta_2O_5$ and SiN. Other possibilities exist. The thickness and placement of the two insulators (adjacent to top or bottom electrode) may be chosen for desired symmetry of the IV curve. A double dielectric may have the benefit of even lower leakage current for unselected memory cells. Another non-linear back-to-back structure that could be used is an MSM (metal-semiconductor-metal) diode, where M could be TiN, TaN, etc., and the semiconductor could be polysilicon or the like. In some embodiments, diode non-linear element 104 may be formed from a polycrystalline semiconductor material such as polysilicon, germanium, or another semiconductor. Also, the diode non-linear element 104 may comprise more than one type of semiconductor. For example, diode non-linear element 104 may be formed from a polycrystalline silicon-germanium alloy, polygermanium or any other suitable combination of semiconductors. In some embodiments, the diode has several regions, each of which may be formed from the same material (but doped differently). However, it is not required that each region be formed from the same material. For example, a heterostructure may be possible. However, the non-linear element 104 is not limited to being a diode.

The transistor 106 may be used to control (e.g., limit) the current through the memory cell 108 during operation. The transistor 106 may be a field effect transistor (FET).

The bit line, the word line, and the source line may each be formed from any suitable conductive material such as tungsten, any appropriate metal, heavily-doped semiconductor material, a conductive silicide, a conductive silicide-germanide, a conductive germanide, or the like.

Figure 1B:
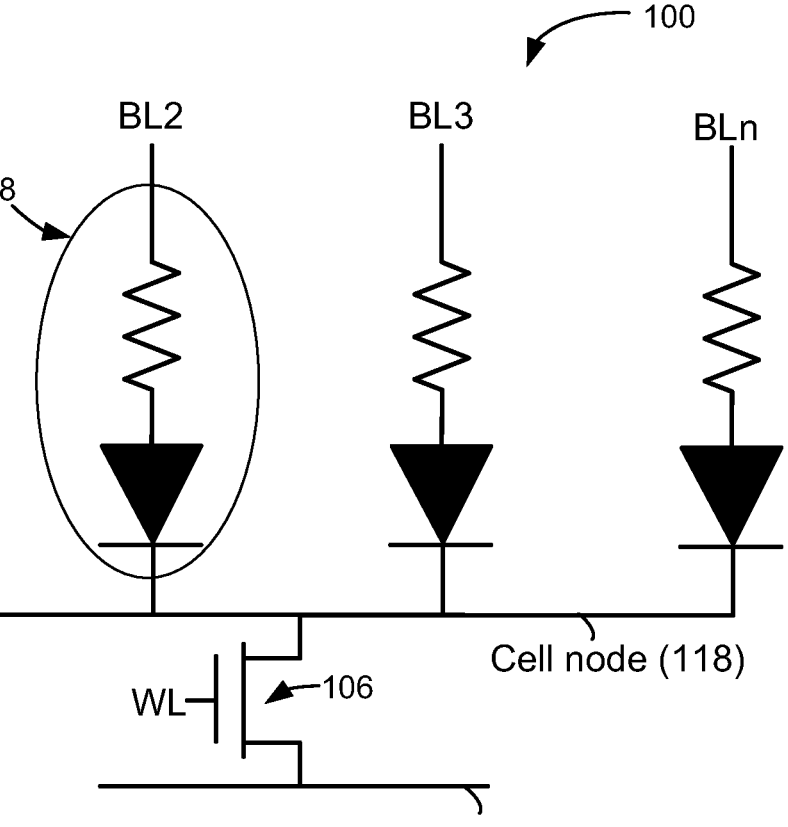
FIG. 1B is a diagram of one embodiment of a memory cell unit in which there are multiple memory cells in the memory cell unit.

FIG. 1B is a diagram of one embodiment of a memory cell unit 100 in which there are multiple memory cells 108 in the memory cell unit 100. In this example, one end of each memory cell 108 is connected to one of the bit lines (BL1 . . . BLn). The other end of the memory cell 108 is connected to a common node, which is connected to the drain of the transistor 106. In other words, the other end of the memory cell 108 is connected to the drain of the transistor 106. There may be any number of memory cells 108 in a memory cell unit 100. Any number of the memory cells can be selected at the same time. In one embodiment, only one memory cell 108 in the unit 100 is selected at one time to minimize interaction between the switching of multiple memory cells 108.

The common node may be referred to as a "cell node." The cell node 118 is a conductive region, in one embodiment. This could be a conductive line, but a different shape could be used. The cell node 118 could be made from any suitable conductive material such as tungsten, any appropriate metal, heavily-doped semiconductor material, a conductive silicide, a conductive silicide-germanide, a conductive germanide, or the like. In one embodiment, the fan out is kept low to reduce capacitance of the cell node 118. The time constant for discharge of the cell node 118 is kept less than the transient time of the bit line programming pulse, in one embodiment. This can help to better regulate programming.

Note that when the memory cell 108 resistance lowers, this could cause a significant increase in the current. However, the transistor 106 can limit the amount of current, which can reduce or prevent unwanted further reduction in the resistance due to the sudden increase in current. However, there can still be a transient current associated with capacitance. For example, there could be a transient surge current due to capacitance of the cell node 118. This current may be expressed as: I=Cdv/dt. By keeping the capacitance of the cell node 118 relatively low, the surge current can be controlled. Therefore, programming of the memory cell 108 is better regulated. One technique for keeping the capacitance of the cell node 118 relatively low is to keep its length relatively short. The length of the cell node 118 is significantly shorter than the length of bit lines or word lines, in one embodiment.

Figure 2A:
FIGS. 2A, 2B, and 2C show a few embodiments of memory cells to discuss possible materials to be used.
Figure 2B:
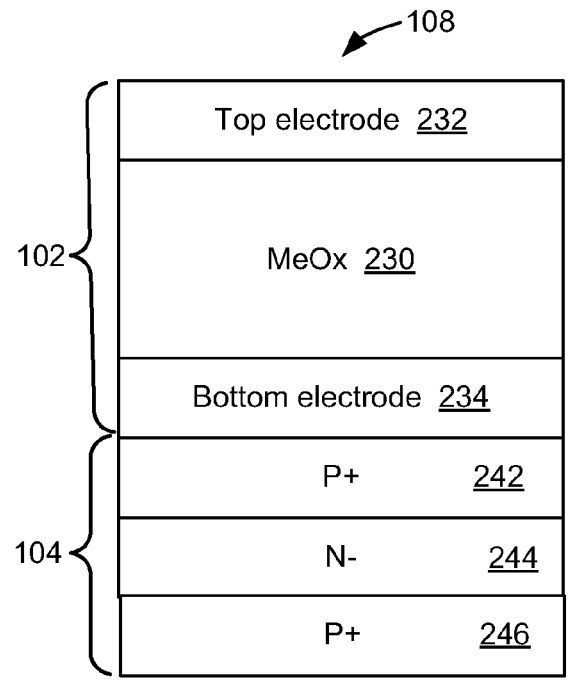
Figure 2C:
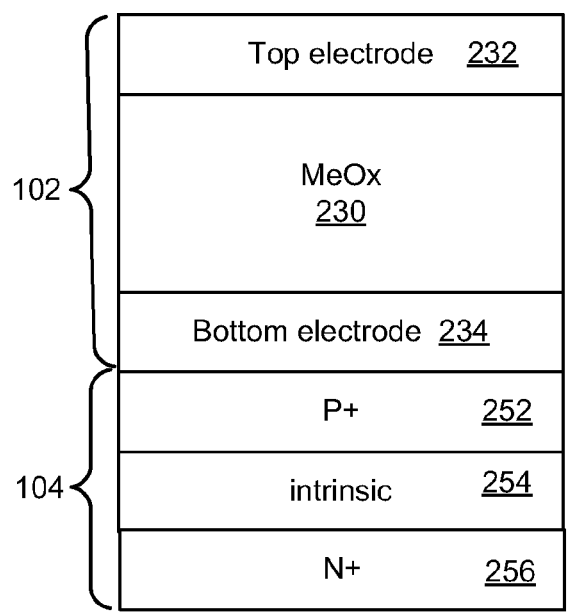

FIGS. 2A-2C show a few examples of memory cells to discuss possible materials to be used. FIG. 2A is a diagram of materials used for one embodiment of a memory cell 108. The memory cell 108 may be used in a memory cell unit 100, such as depicted in FIG. 1A, 1B, other examples described herein, etc. The memory cell 108 includes a bottom electrode 202, SiN region 204, metal oxide 206, SiN region 208, and top electrode 210. The metal oxide 206 may form at least part of the reversible resistance storage element 102, in this embodiment. Either or both SiN regions 204, 208 may form at least a part of the non-linear element 104, in this embodiment. Either or both SiN regions 204, 208 may serve as a tunneling dielectric.

The bottom electrode 202 is formed from p+ silicon, in one embodiment. The top electrode is formed from TiN, in one embodiment. The top electrode 210 may be connected to the bit line (either directly or indirectly). The bottom electrode 202 may be connected to the drain of the transistor 106 (either directly or indirectly).

FIG. 2B is a diagram of one embodiment of materials used for a memory cell 108 in which the non-linear element 104 is a diode. In this embodiment, the diode is a PNP diode. More specifically, region 242 is P+, region 244 is N− and region 246 is P+. The diode may be a punch-thru diode. One alternative is to use an N+/P−/N+ device. This may operate as an NPN punch through diode. In FIG. 2B, the reversible resistance storage element 102 comprises a MeOx region 230, as well as the top electrode 232 and bottom electrode 234. In one embodiment, electrode 232 is made of TiN. In one embodiment, electrode 234 is made of titanium nitride. The top electrode 232 and bottom electrode 234 could be made of other materials. Materials for MeOx have already been discussed.

FIG. 2C is a diagram of one embodiment of materials used for a memory cell 108 in which the non-linear element 104 is a pin diode. More specifically, region 252 is P+, region 254 is intrinsic, and region 256 is N+. One alternative is for regions 252 and 256 to be switched. In FIG. 2B, the reversible resistance storage element 102 comprises a MeOx region 230, as well as the top electrode 232 and bottom electrode 234. In one embodiment, electrode 232 is made of TiN. In one embodiment, electrode 234 is made of titanium nitride. The top electrode 232 and bottom electrode 234 could be made of other materials. Materials for MeOx have already been discussed.

Although the examples in FIG. 2A-2C refer to a MeOx material in the reversible resistance storage element 102, the memory cell 108 is not limited to MeOx. Numerous other materials have already been discussed, as possible alternatives.

Figure 3A:
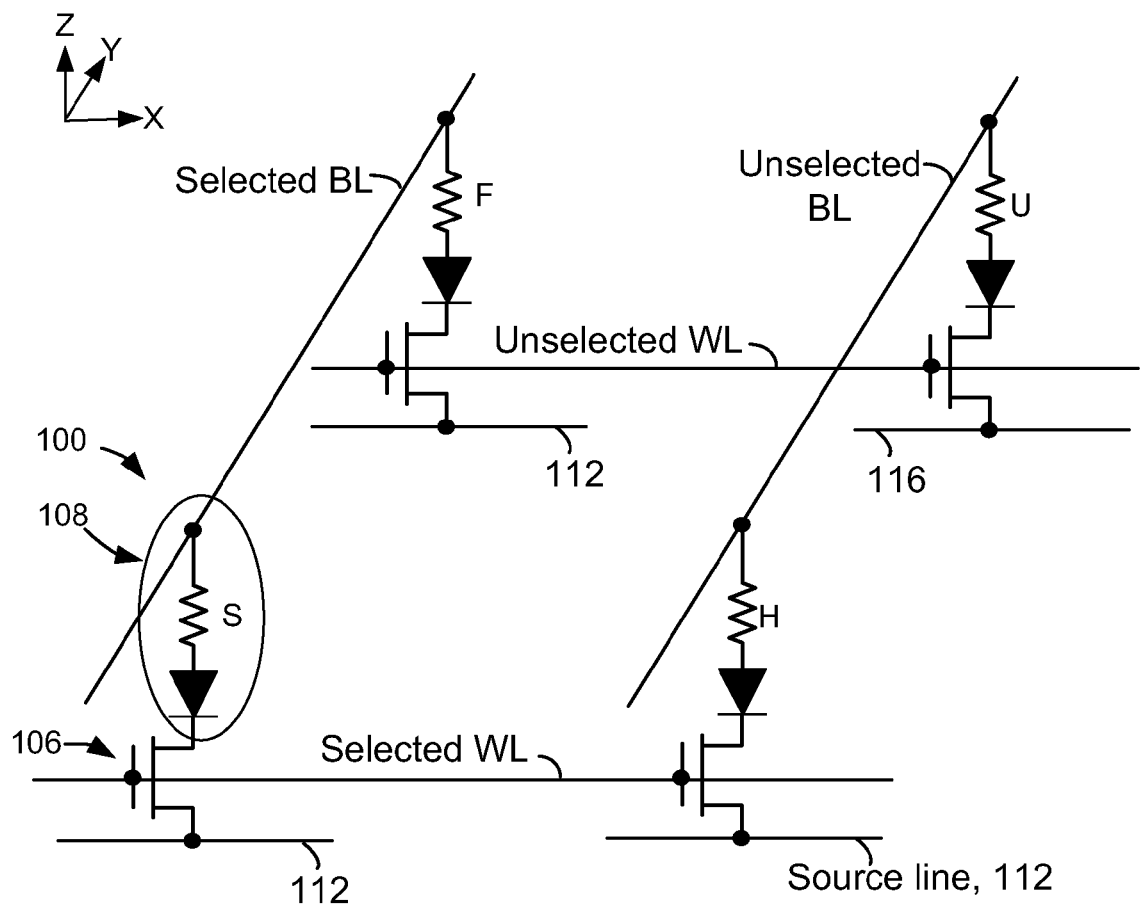
FIG. 3A is a diagram of one embodiment of a portion of a 3D memory array.

FIG. 3A is a diagram of one embodiment of a portion of a 3D memory array 300. Two bit lines and two word lines are depicted. Typically, the memory array 300 will have many more bit lines and many more word lines by extending the structure of FIG. 3A. For purposes of discussion, one bit line is depicted as selected and the other as unselected. Likewise, one word line is depicted as selected and the other word line as unselected. In one embodiment, there may be many selected bit lines in a unit formed by extending the structure of FIG. 3A to have many bit lines and many word lines. However, a single word lines is selected in some embodiments. In one embodiment, the word lines are parallel to each other and the bit lines are parallel to each other. The word lines may be orthogonal to the bit lines; however, this is not a requirement.

Four memory cell units 100 are depicted. The memory cell units 100 that are depicted are part of one level of the 3D memory array. In this example, bit lines are shown as extending in the y-direction, and word lines as extending in the x-direction. Note that there can be many levels in the 3D memory array. For example, the array can be extended in the z-direction by adding more levels of memory cell units 100. In one embodiment, bit lines are shared between two levels of memory cell units 100. For example, there could be another set of memory cell units 100 (not depicted in FIG. 3A) that mirror the ones in FIG. 3A. These mirrored memory cell units 100 could share the bit lines depicted in FIG. 3A. In one embodiment, bit lines are not shared between two levels of memory cell units 100. Thus, the next level of memory cell units 100 would not share bit lines with another level of memory cell units 100.

Each memory cell unit 100 has a single memory cell 108 in this example. Thus, the memory cell units 100 are similar to the one depicted in FIG. 1A. The memory cell 108 that is connected to the selected BL and the selected WL is indicated as selected (S). Note that the word lines drive the gates of the transistors 106, in this embodiment.

There are three unselected memory cells 108, which are labeled differently based on their connections to bit lines and the connection of their associated transistor 106 to word lines. The memory cell 108 that is connected to the selected BL and having its transistor 106 connected to the unselected WL is indicated as unselected (F). The memory cell 108 that is connected to the selected WL and having its transistor 106 connected to the unselected BL is indicated as unselected (H). The memory cell 108 that is connected to the unselected WL and having its transistor 106 connected to the unselected BL is indicated as unselected (U).

As one operational example, voltages to the bit lines, word lines, and source lines, may be as follows. The selected bit line may be biased to Vd. The value for Vd may depend on which operation is being performed (e.g., form, training, set, reset). Also, the value of Vd may change during an operation. For example, Vd can be increased from one loop to the next. Further details are discussed below. The unselected bit line may be grounded. In one embodiment, unipolar mode is used. Therefore, Vd has the same polarity for form, train, set, and reset in one embodiment of unipolar mode.

The selected word line may be biased to Vg, which turns on the transistor 106. In one embodiment, Vg is a relatively low voltage so that the transistor 106 (e.g., FET) is in current limiter mode (e.g., saturated mode). The value for Vg may depend on the operation or the type of FET used. In one embodiment, Vg is different (e.g., higher) during training than for set and reset. This allows for a higher current limit during training, which may condition the memory cell 108 so that conductive paths are formed more easily during SET.

The unselected word line may be biased to a voltage that keeps the transistor 106 off. For example, the unselected word line may be grounded. The common source line may be grounded. The body of the transistor 106 may be grounded, as well, although a voltage different from the source line voltage could be used.

Given the foregoing example, memory cells marked S and H (those associated with the selected word line) will have the transistor 106 in their memory cell unit 100 on. On the other hand, memory cells marked F and U (those associated with the unselected word line) will have the transistor 106 in their memory cell unit 100 off.

Thus, the selected memory cell (S) has its associated transistor 106 on and its bit line at Vd. In one embodiment, the transistor 106 limits the current through the selected memory cell (S) 108 during operations such as form, train, set and reset.

The unselected memory cell (H) has its associated transistor 106 on and its bit line at 0V. However, with 0V on both the unselected bit line and source line, the unselected memory cell (H) 108 should not receive programming.

The unselected memory cell (F) has its associated transistor 106 off and its bit line at Vd. The unselected memory cell (U) has its associated transistor 106 off and its bit line at 0V. The transistors 106 that are off do not conduct a significant current, in one embodiment. Thus, these memory cells (F, U) should not receive programming. Therefore, even though unselected memory cell (F) has Vdd on the selected bit line it should not receive programming in this example.

In some embodiments, the memory array 300 is operated in unipolar mode. This means that the same polarity voltage is applied during SET and RESET. Furthermore, the FORMING voltage may be the same polarity voltage as SET and RESET. In the above example, this means that Vd applied to the selected bit line may be positive for both SET and RESET. The selected bit line voltage may also be positive for FORMING. In some embodiments, there is a TRAINING phases prior to normal operation (e.g., prior to set and reset). The selected bit line voltage may also be positive for TRAINING.

Figure 3B:
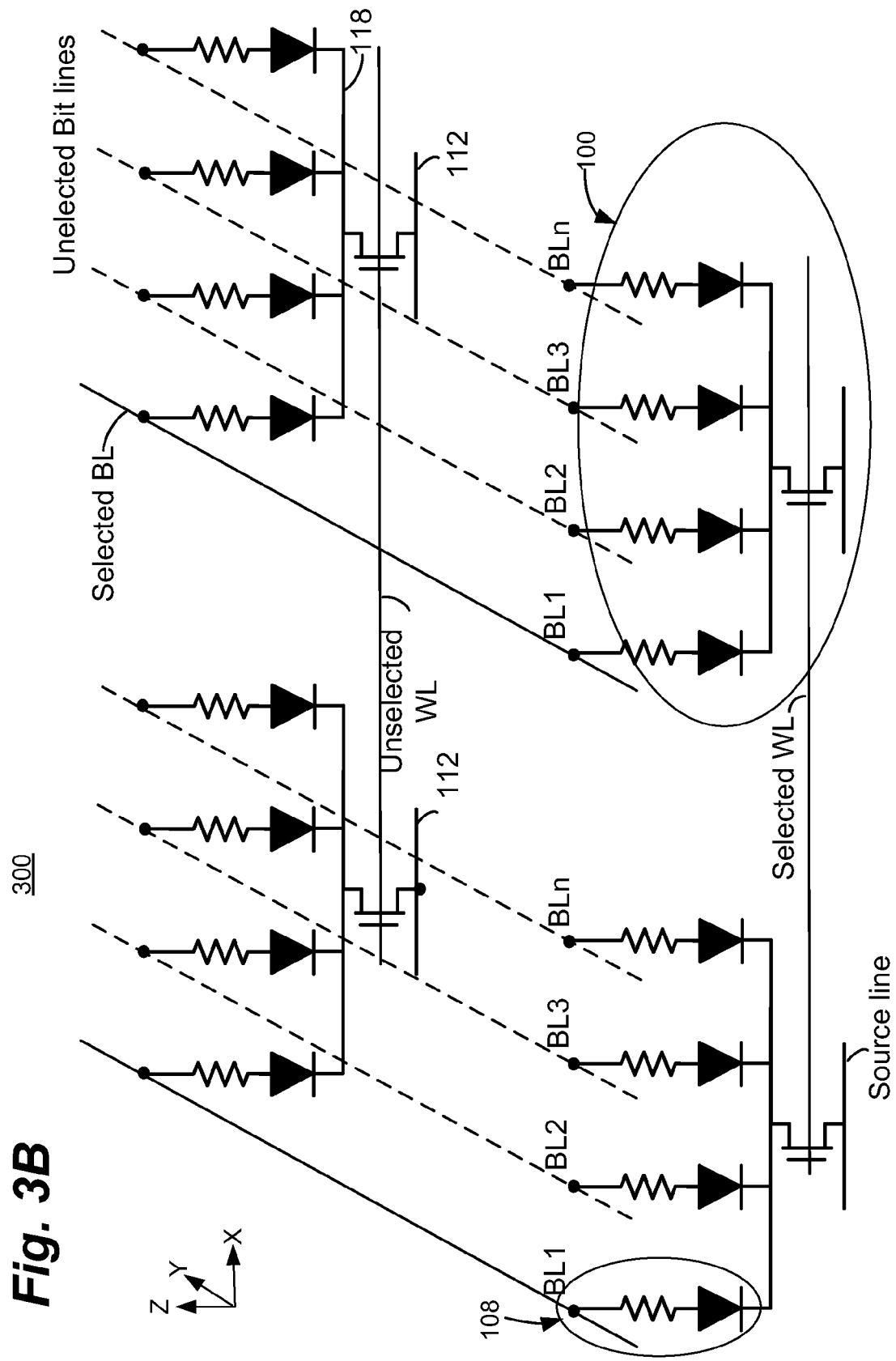
FIG. 3B is a diagram of one embodiment of a portion of a memory array in which each memory cell unit has "n" memory cells.

FIG. 3B is a diagram of one embodiment of a portion of a memory array 300. In this embodiment, each memory cell unit 100 has "n" memory cells 108. Thus, each memory cell unit 100 is similar to the example depicted in FIG. 1B. One word line is associated with each memory cell unit 100. Two word lines are depicted, one selected and the other unselected. Each memory cell unit 100 is associated with "n" bit lines. Thus, in this example, each memory cell 108 is associated with a bit line and a word line.

In this example, one of the bit lines associated with each of the memory cell units 100 is selected, whereas the other bit lines are unselected. However, this is not a requirement. Any number of the bit lines associated with a memory cell unit 100 may be selected. Thus, 0 to n of the bit lines may be selected at the same time. The voltages that are applied to the bit lines, source lines and word lines may be similar to the example of FIG. 3A.

The bit lines can be made very long to save support area. The word lines can also be made very long. In one embodiment, the cell node 118 is more limited in length to reduce or capacitance. In other words, fan out of the memory cell unit 100 is limited to reduce capacitance.

Figure 4A:
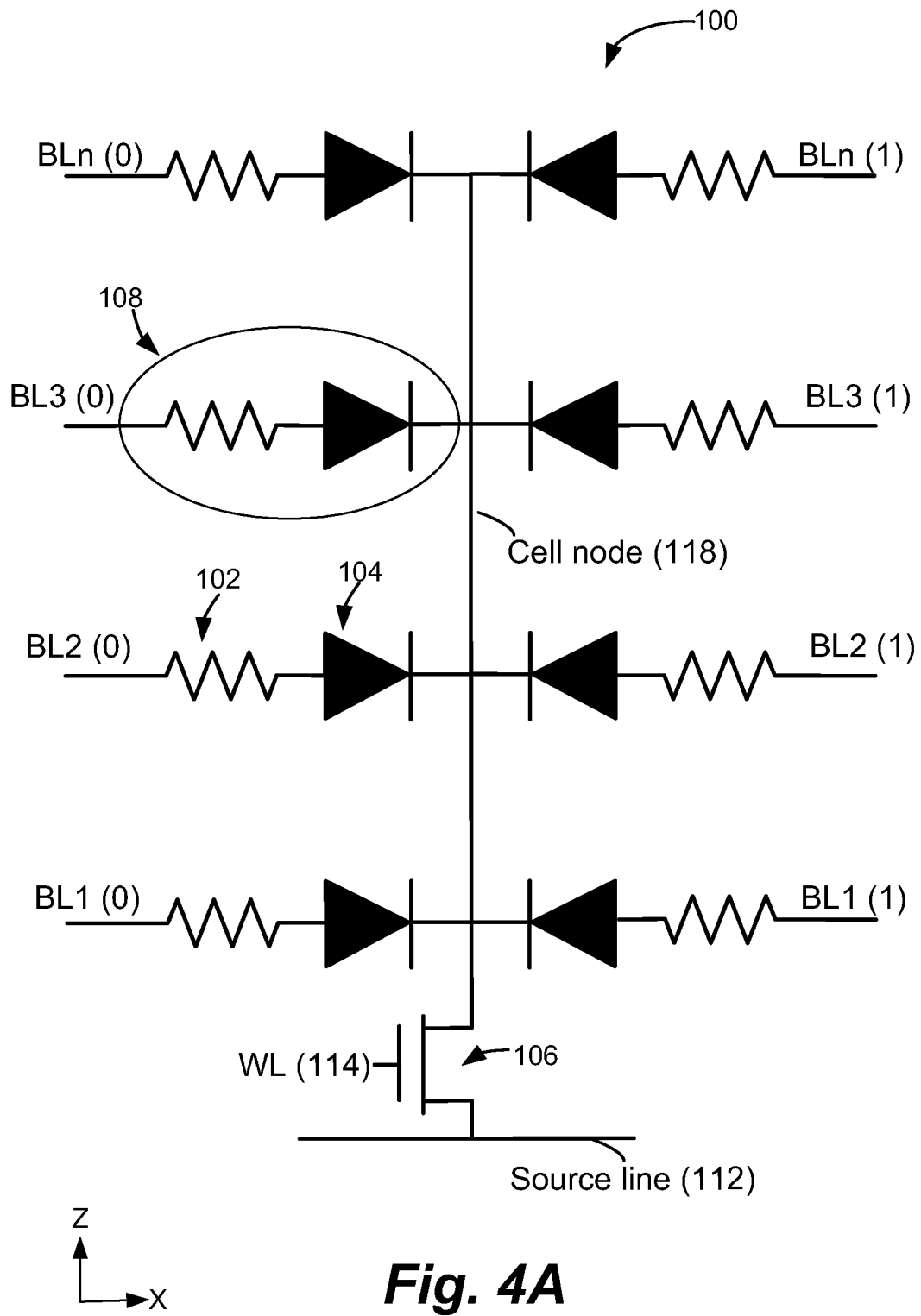
FIG. 4A is a schematic diagram depicting one embodiment of a memory cell unit 100 in which the cell node is oriented vertically.

FIG. 4A is a schematic diagram depicting one embodiment of a memory cell unit 100 in which the cell node 118 is oriented vertically (in the z-direction). The memory cell unit 100 has memory cells 108 and a transistor 106. The memory cells 108 may be similar to the one discussed with respect to FIG. 1A. The memory cell unit 100 has some similarities to the one of FIG. 1B. However, in this case, the cell node 118 is oriented vertically. The cell node 118 is connected to the drain of the transistor 106.

The memory cells 108 on the left half are each connected to one of the bit lines labeled BL1(0)-BLn(0). Similarly, the memory cells 108 on the right half are each connected to one of the bit lines labeled BL1(1)-BLn(1). Thus, each memory cell 108 in the unit 100 is connected to a different bit line, in this example.

Figure 4B:
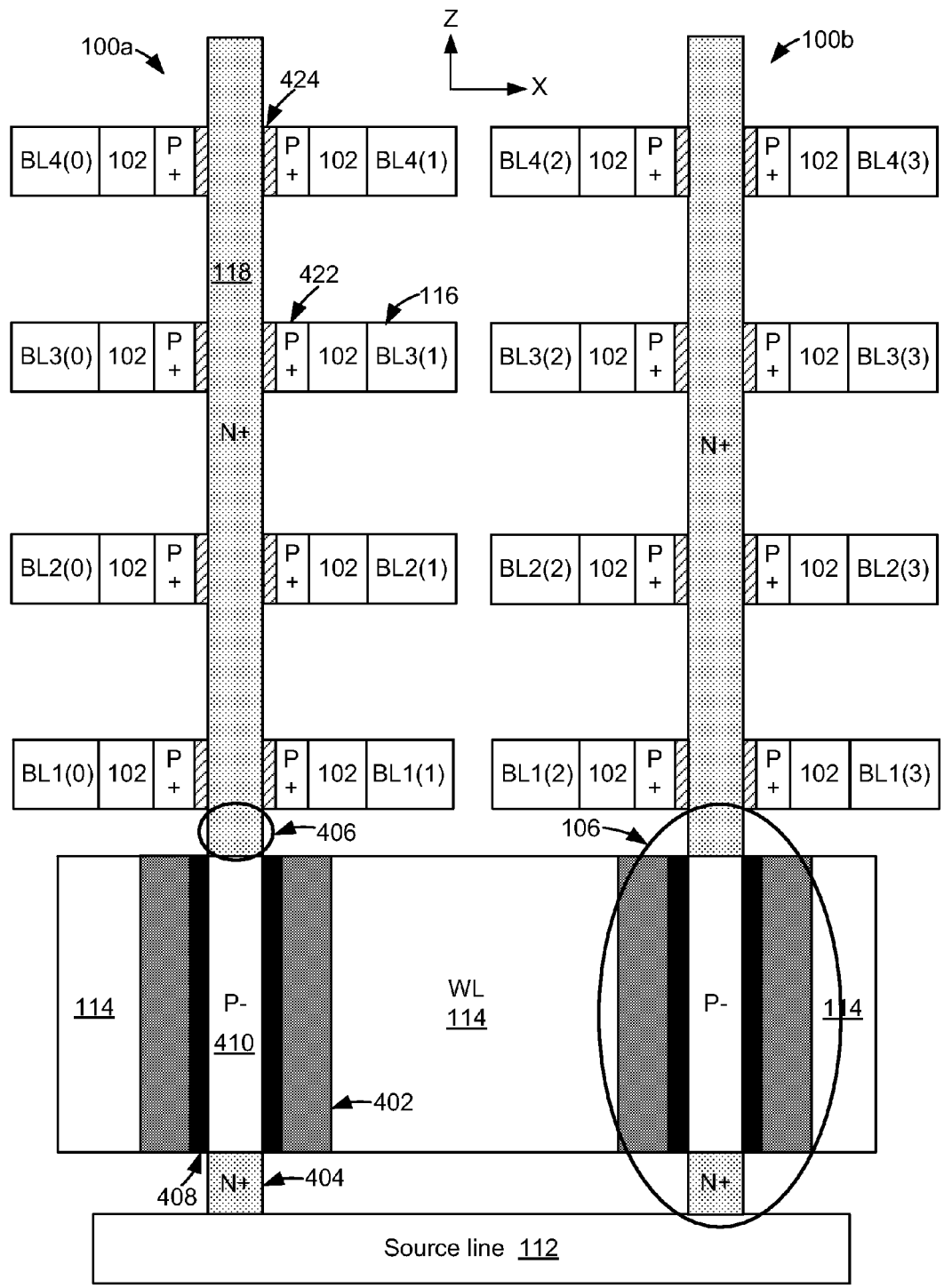
FIG. 4B is a diagram of one embodiment of a portion of a memory array.

FIG. 4B is a diagram of one embodiment of a portion of a memory array 300. Two memory cell units 100a, 100b are depicted. The memory cell units 100 correspond to the memory cell unit 100 in the schematic diagram of FIG. 4A. The source line 112 is shared between the two memory cell units 100a, 100b. The word line 114 is common to the two memory cell units 100a, 100b. The word line 114 may be common to many other memory cell units 100 not depicted in FIG. 4B.

Bit lines BL1(0)-BL4(0), as well as BL1(1)-BL4(1) are associated with memory cell unit 100a. Bit lines BL1(2)-BL4(2), as well as BL1(3)-BL4(3) are associated with memory cell unit 100b. Bit lines 116 could be shared by adjacent memory cell units 100. For example, bit lines BL1(1)-BL4(1) could be merged with their counterparts of BL1(2)-BL4(2).

The bit lines 116, the word line 114, and the source line 112 may each be formed from any suitable conductive material such as tungsten, any appropriate metal, heavily-doped semiconductor material, a conductive silicide, a conductive silicide-germanide, a conductive germanide, or the like.

Each memory cell unit 100 has a transistor 106. The transistor 106 may be an FET. The transistor 106 comprises gate 402, gate dielectric 408, source 404, drain 406, and channel 410. Two gates 402 are depicted for each transistor 106. In this example, the transistor 106 has a vertical channel. That is, the channel 410 extends in the z-direction. The gates 402 may be formed from TiN, as one example. The gate dielectric 408 may be formed from silicon oxide, silicon nitride, etc.

In this example, the source 404 and drain 406 are doped N+. As one example, this is highly doped polysilicon. The same material that serves as the drain 406 may serve as the cell node 118, but this is not required. The body region 410 is P– in this example. The body 410 may be formed without intentionally doping (e.g., intrinsic). The source 404 and drains 406 could be P+ instead.

Because the word line 114 is common to multiple memory cell units 100, the gate of transistor 106 in a memory cell unit 100a is connected to the gate of the transistor 106 in memory cell unit 100b. Also, the source 404 of the transistor 106 in a memory cell unit 100a is connected to the source 404 of the transistor 106 in memory cell unit 100b via the common source line 112. In one embodiment, the transistors 106 in each unit 100a, 100b are both pMOS devices. In one embodiment, the transistors 106 in each unit 100a, 100b are both nMOS devices. In one embodiment, the transistors 106 associated with a given word line 114 are either all either pMOS devices or all nMOS devices.

The reversible resistance storage element 102 is depicted between a bit line 116 and a P+ region 422. The reversible resistance storage element 102 could include a top electrode 232, MeOx 230, and a bottom electrode 234, as depicted in, for example FIG. 2C. However, the reversible resistance storage element 102 could have many other configurations. It is not required be use MeOx. Many other switching materials have been discussed herein.

The P+ region 422, intrinsic region 424, and adjacent portion of the N+ cell node 118 form a non-linear element 104, in this example. For example, the non-linear element 104 comprises a PIN diode, in this example. Many other types of non-linear elements 104 could be used instead. Also, it is not required that a portion of the cell node 118 be used to form part of the non-linear element 104. However, this may simplify the design and fabrication.

Note that additional regions could be used in the structure. In some embodiments, the reversible resistance storage element 102 is formed from MeOx. However, note that the memory cell 108 could be formed from a wide variety of different materials. Thus, note that the architecture in which the cell node 118 is vertical can be used with a wide variety of memory cells 108. As noted herein, the memory cell 108 may comprise a wide variety of materials in the reversible resistance storage element 102 and a wide variety of non-linear elements 104. The discussion of FIG. 1A contained numerous examples of suitable materials for the memory cell 108. The basic structure of FIG. 4B could be used with any such materials, but is not expressly limited to those examples.

Figure 4C:
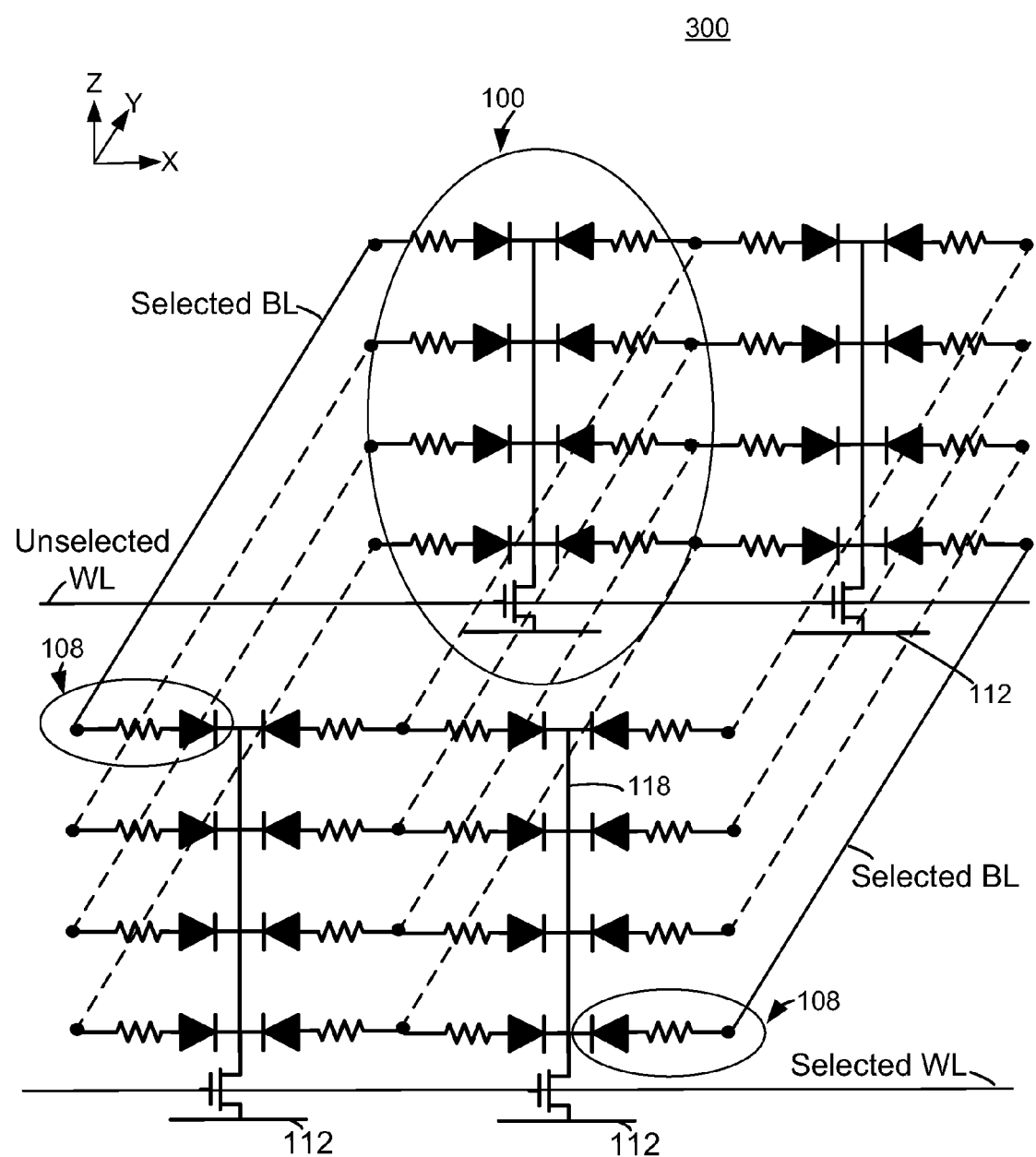
FIG. 4C is a diagram depicting one embodiment of a portion of one level of a 3D memory array in which the cell nodes are oriented vertically.

FIG. 4C is a diagram depicting one embodiment of a portion of one level of a 3D memory array 300 in which the cell nodes 118 are oriented vertically. The four memory cell units 100 in FIG. 4C are similar to the memory cell unit 100 of FIG. 4A. One word line is selected, the other WL is unselected. The two bit lines depicted by a solid line are selected. The bit lines depicted by dashed lines are unselected. The two memory cells 108 that are selected are circled. In this example, some of the bit lines are shared by two adjacent memory cell units 100 on the same level of the 3D memory array 300. However, sharing of bit lines between memory cell units 100 is optional. Recall that FIG. 4B shows one example in which bit lines are not shared between memory cell units 100 on the same level of the 3D array 300.

Figure 5:
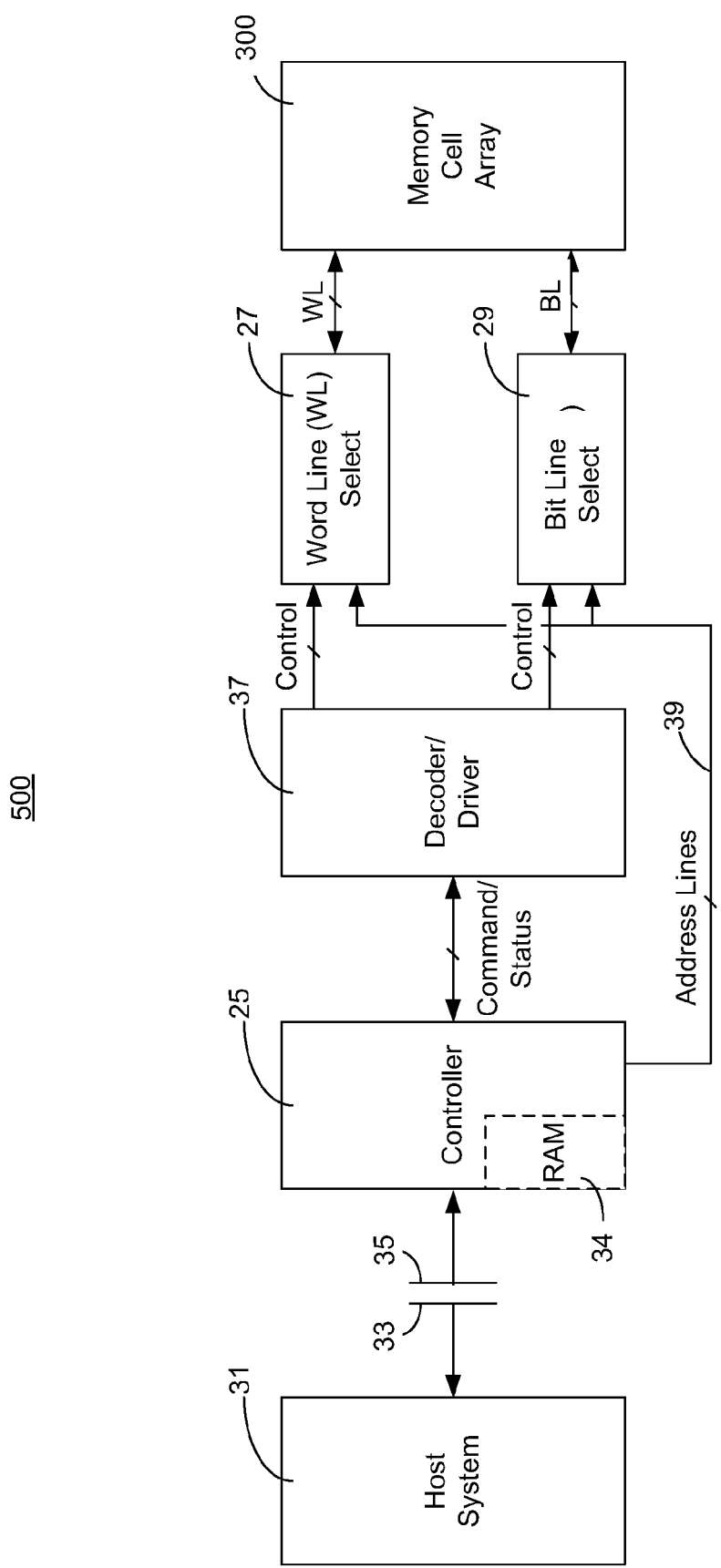
FIG. 5 is a block diagram of an illustrative memory system that can use the memory cell units described herein.

FIG. 5 is a block diagram of an illustrative memory system that can use the memory cell units 100 described herein. Memory system 500 includes a memory array 300 that can be a two or three dimensional array of memory cell units 100 as described herein. In one embodiment, memory array 300 is a monolithic three dimensional memory array. The array terminal lines of memory array 300 include the various layer(s) of word lines, and the various layer(s) of bit lines.

Controller 25 receives data and commands from a host 31 and provides output data to the host 31. In other embodiments, controller 25 receives data and commands from a separate controller circuit and provides output data to that controller circuit, with the controller circuit communicating with the host. Controller 25 may include one or more state machines, registers and other control logic for controlling the operation of memory system 500.

Controller 25 usually contains an amount of random-access-memory (RAM) 34 for temporarily storing such data and operating information. Commands, status signals and addresses of data being read or programmed are also exchanged between the controller 25 and host 31. The memory system operates with a wide variety of host systems. They include personal computers (PCs), laptop and other portable computers, cellular telephones, personal digital assistants (PDAs), digital still cameras, digital movie cameras and portable audio players. The host typically includes a built-in receptacle 33 for one or more types of memory cards or flash drives that accepts a matching memory system plug 35 of the memory system but some hosts require the use of adapters into which a memory card is plugged, and others require the use of cables therebetween. Alternatively, the memory system may be built into the host system as an integral part thereof.

Controller 25 conveys to decoder/driver circuits 37 commands received from the host 31. Similarly, status signals generated by the memory system are communicated to the controller 25 from decoder/driver circuits 37. The circuits 37 can be simple logic circuits in the case where the controller controls nearly all of the memory operations, or can include a state machine to control at least some of the repetitive memory operations necessary to carry out given commands. Control signals resulting from decoding commands are applied from the circuits 37 to the word line select circuits 27, local bit line select circuits 29 and data input-output circuits 21. Also connected to the circuits 27 and 29 are address lines 39 from the controller that carry physical addresses of memory elements to be accessed within the array 300 in order to carry out a command from the host. The physical addresses correspond to logical addresses received from the host system 31, the conversion being made by the controller 25 and/or the decoder/driver 37.

In some embodiments, the word line select 27 is used to provide a control voltage to gates of transistors 106 in the memory units 100. That is, the voltages may be provided to the word lines, which may be connected to the gates. In some embodiments, the bit line select 29 is used to provide program voltages (e.g., set, reset) to bit lines in the memory units 100. Likewise, forming voltages and training voltages may be provided to the bit lines. In effect, the bit line select 29 may serve as logic for providing data to be programmed into the memory cells 108. In one embodiment, the word line select 27 serves as logic that drives the gate of the transistor 106 in the memory cell unit 100 to turn on the transistor 106 and connect the memory cell 108 in the memory cell unit to the source 404 of the transistor 106. On the other hand, the memory cell 108 in the memory cell unit 100 may be disconnected from the source 404 of the transistor 106 when the gate of the first transistor 106 is off.

In some embodiments, reading of the memory cells 108 is accomplished by applying suitable voltages to the bit lines and word lines and testing for a current that flows through the memory cell 108. In one embodiment, the current that flows through the source node of the transistor 106 associated with the memory cell 108 is sensed. Sense circuitry is not depicted in FIG. 5.

Figure 6A:
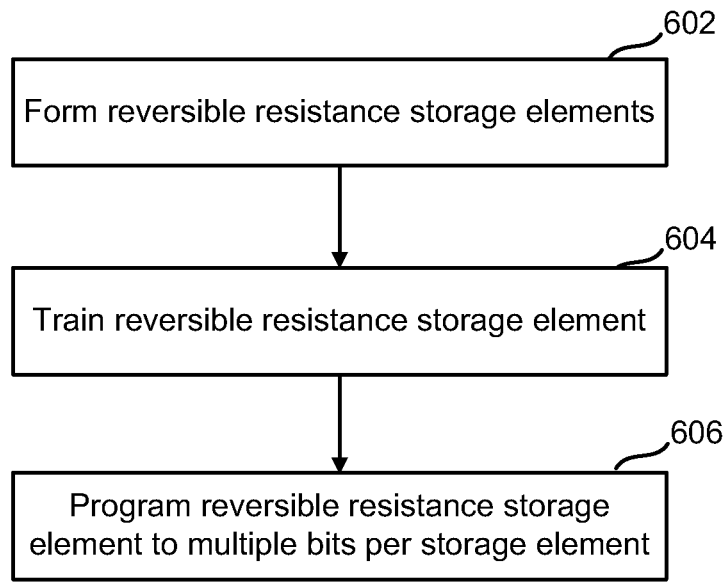
FIG. 6A is a flowchart of one embodiment of a process of operating non-volatile storage.

FIG. 6A is a flowchart of one embodiment of a process of operating non-volatile storage. The process can be used with various memory cell units 100 described herein, but is not limited to these examples. In general, the process includes forming reversible resistance storage elements 602, training the reversible resistance storage elements 604, and programming the reversible resistance storage elements 606. In one embodiment, the memory array 300 is operated in unipolar mode. Thus, the bit line voltages for all of steps 602, 604, 606 have the same polarity in one embodiment. In other words, the forming, training, set and reset voltages all have the same polarity, in one embodiment.

Figure 6B:
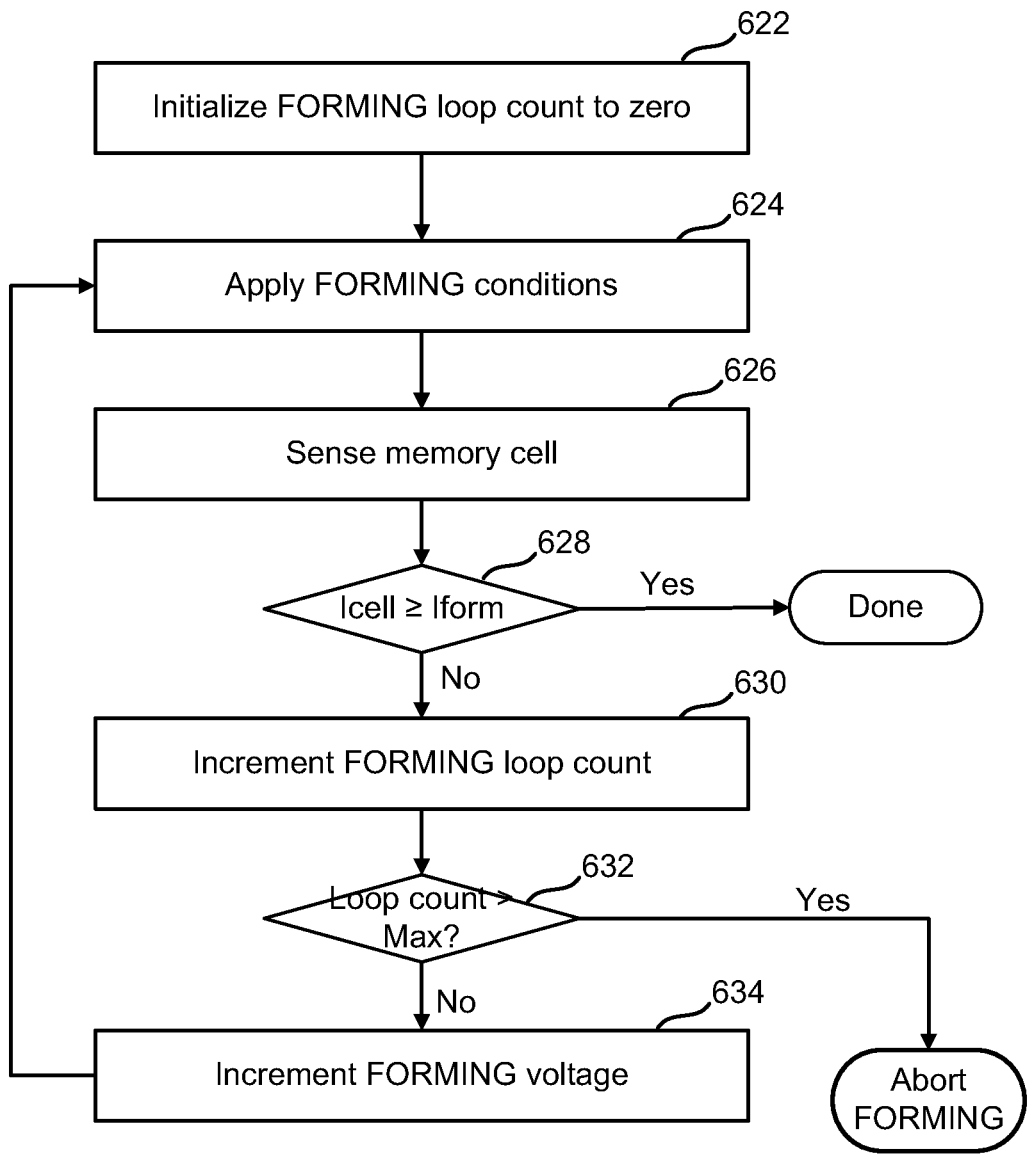
FIG. 6B shows further details of one embodiment of FORMING.

The forming step 602 is typically performed on "virgin" memory cells 108. Typically, a memory cell 108 is in a high resistance state after fabrication. The forming step lowers the resistance of the memory cells 108. In one embodiment, one or more forming voltages are applied to the memory cell 108 until the memory cell 108 has a resistance that is less than a target value. FIG. 6B shows further details of one embodiment of forming. In one embodiment, the forming voltage is applied to the bit line 116 associated with the memory cell 108, while the source line is grounded. Also, a voltage is applied to the word line 114 associated with the memory cell 108 such that the transistor 106 associated with the memory cell 108 is turned on. After applying the forming voltage, the memory cell 108 is sensed to determine whether its resistance has been decreased to the target forming resistance. If not, additional forming voltages may be applied until the resistance is reduced to the target forming resistance. The forming voltage is increased in magnitude between one loop and the next, in one embodiment. For some memory devices, forming causes oxygen ions to move to the anode such that filaments are created. These filaments may act as a conduction path for electrons to easily travel during a read operation.

The training step 604 establishes an initial percolation path in the reversible resistance storage element 102, for some types of memory cells 108. The training step 604 may serve to improve endurance of the memory cells 108. The training is performed after forming is complete, but prior to programming, in one embodiment. However, the training step is combined with the forming step in one embodiment. Thus, no separate forming step is required in one embodiment. FIGS. 10B and 10C depict one embodiment of a combined forming/training process.

In one embodiment, step 604 includes applying a gate-to-source voltage to the transistor 106 in the memory cell unit 100. The source line 112 may be grounded, and a suitable voltage applied to a word line 114 connected to the gate to achieve the gate-to-source voltage. This may limit the current through the memory cell 108 being trained. Note that the transistor 106 may be connected in series to the memory cell 108. At the same time, a training signal may be applied to a selected bit line 116 connected to memory cell 108, which has a reversible resistance storage element 102. The training signal may be a voltage, such as a voltage pulse. Thus, the transistor 106 may limit a current of the reversible resistance storage element 102 that results from applying the training signal to the selected bit line.

The programming in step 606 refers to normal operation of the memory array 300 in which memory cells 108 are set and reset. In one embodiment, step 606 includes programming reversible resistance storage elements 102 in memory cells 108 between a lower resistance data state and a higher resistance data state. Note that there may be more than two data states, as will be discussed below.

The programming may include applying a different gate-to-source voltage to the transistor 106 than was used during the training of step 604. This may result in a different current limit than the current limit during training. In one embodiment, the current limit during training is higher than the current limit during programming (e.g., set and reset). The higher current permitted during training may allow filaments to form more easily during programming.

The gate-to-source voltage is applied to the transistor 106 while applying a programming signal to the selected bit line connected to the memory cell 108 being programmed. Note that the common source line 112 may be grounded, and a voltage applied to a word line 114 that connects to the gate to achieve the gate-to-source voltage. As noted herein, the memory cells 108 have reversible resistance storage elements 102. Thus, the transistor 106 may limit a current of the reversible resistance storage element 102 that results in response to the programming signal. The programming signal is a voltage (e.g., voltage pulse) applied to the selected bit line 116, in one embodiment.

FIG. 6B shows further details of one embodiment of FORMING. This may be used for step 602 in FIG. 6A. In step 622, a loop count is initialized. In step 624, FORMING conditions are applied. In one embodiment, a FORMING voltage is applied to the bit line 116 associated with the memory cell 108, while the source line is grounded. Also, a voltage is applied to the word line 114 associated with the memory cell 108 such that the transistor 106 associated with the memory cell 108 is turned on.

Example parameters for FORMING are as follows. The Vgs of the transistor 106 may be about 0.8V. This may be achieved by grounding the common source line 112 and applying a suitable voltage to the word line 114 associated with the memory cell unit 100 having the memory cell 108 being formed. The initial FORMING voltage (which may be applied to the bit line 116) may be 5 V, increasing by 0.1V with each iteration. A different initial forming voltage and increment may be used. The FORMING voltage may have a maximum of 9V, as one example. The FORMING voltage has a pulse width of $100 \times 10^{-3}$ seconds (100 milliseconds), in one embodiment. Other parameters may be used for FORMING.

In step 626, the memory cell 108 is sensed. Thus, after applying the FORMING voltage, the memory cell 108 is sensed to determine whether its resistance has been decreased to the target forming resistance. Sensing the memory cell 108 determines the memory cell's current, in one embodiment. In one embodiment, a read reference voltage is applied to the bit line 116 associated with the memory cell 108. In one embodiment, the current of the memory cell 108 that results from applying the read reference voltage is sensed and compared to a reference current. An example reference current is 10 nA. A different value could be used.

In step 628, the memory cell's current is compared to a target FORMING current, Iform. Iform corresponds to the target resistance, given the magnitude of the voltage applied in the sensing step. If the memory cell's current (and hence resistance) has reached the target level, then the process concludes. Otherwise, the process continues at step 630.

In step 630, the FORMING loop count is incremented. In step 632, the loop count is compared to a maximum allowed loop count. If the loop count exceeds a maximum, then the process may abort. One option is to flag the memory cell such that it is not used. However, another option is to make further attempts to FORM the memory cell. Also, instead of using a loop count, the magnitude of the FORMING voltage could be used to determine whether FORMING should be aborted.

Assuming the loop count has not yet reached the maximum, the FORMING voltage is incremented in step 634. An example increment is 0.1V. However, the increment could be larger or smaller. The process then goes to step 624 to apply the FORMING conditions. Thus, additional forming voltages may be applied until the resistance is reduced to the target forming resistance. As noted, the forming voltage is increased in magnitude between one loop and the next, in one embodiment. The FORMING voltage is not required to be increased between one loop and the next. For example, the FORMING voltage might be increased between some loops, but not increased for others. Also a different step size (e.g., voltage increment) could be used for different iterations.

Figure 7:
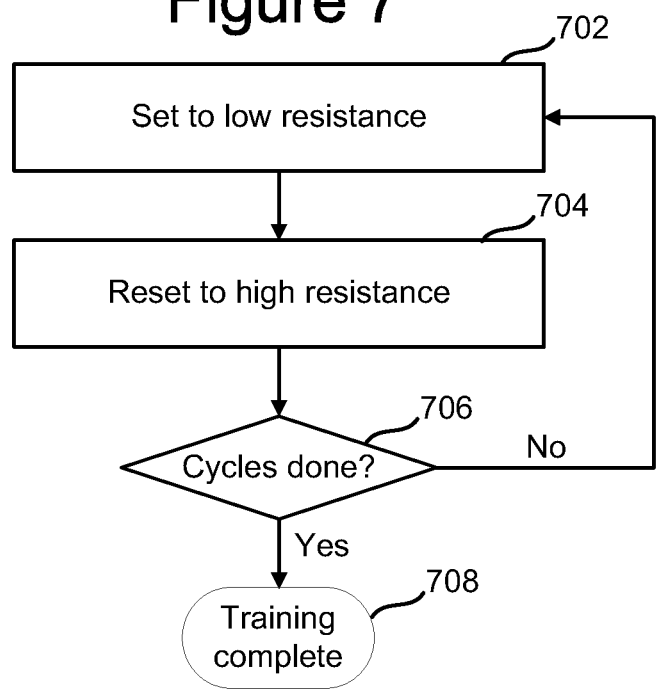
FIG. 7 is a flowchart of one embodiment of training the reversible resistance storage elements.

FIG. 7 is a flowchart of one embodiment of training the reversible resistance storage elements 102. This is one embodiment of step 604 of FIG. 6, and shows an overview of a training process for one memory cell 108. In general, the memory cell 108 has its resistance cycled between a low resistance target and a high resistance target for some target number of cycles.

In step 702, the memory cell 108 is set to a low resistance. The term "set" is being used because this is similar to the SET step that occurs during programming. However, it will be understood that the training process is not used to store data in the memory cells 108. Rather, it may be considered to be a conditioning/initialization process.

In general, step 702 may include applying one or more training voltages to the memory cell 108. After each training voltage is applied, the resistance of the memory cell 108 may be tested to determine whether it is at the target set resistance. Further details are discussed in connection with FIG. 8.

In step 704, the memory cell 108 is reset to a high resistance. The term "reset" is being used because this is similar to the RESET step that occurs during programming. As noted above, it will be understood that the training process is not used to store data in the memory cells 108.

In general, step 704 may include applying one or more training voltages to the memory cell 108. After each training voltage is applied, the resistance of the memory cell 108 may be tested to determine whether it is at the target reset resistance. Further details are discussed in connection with FIG. 9. In one embodiment, the polarity of the training voltage is the same for steps 702 and 704.

In step 706, a determination is made whether the target number of cycles has been achieved. The target number of cycles may be 5-10 cycles; however, a lower a higher target could be used. If the target number of cycles has not been reached, the process returns to step 702. Otherwise, the process concludes.

Figure 8:
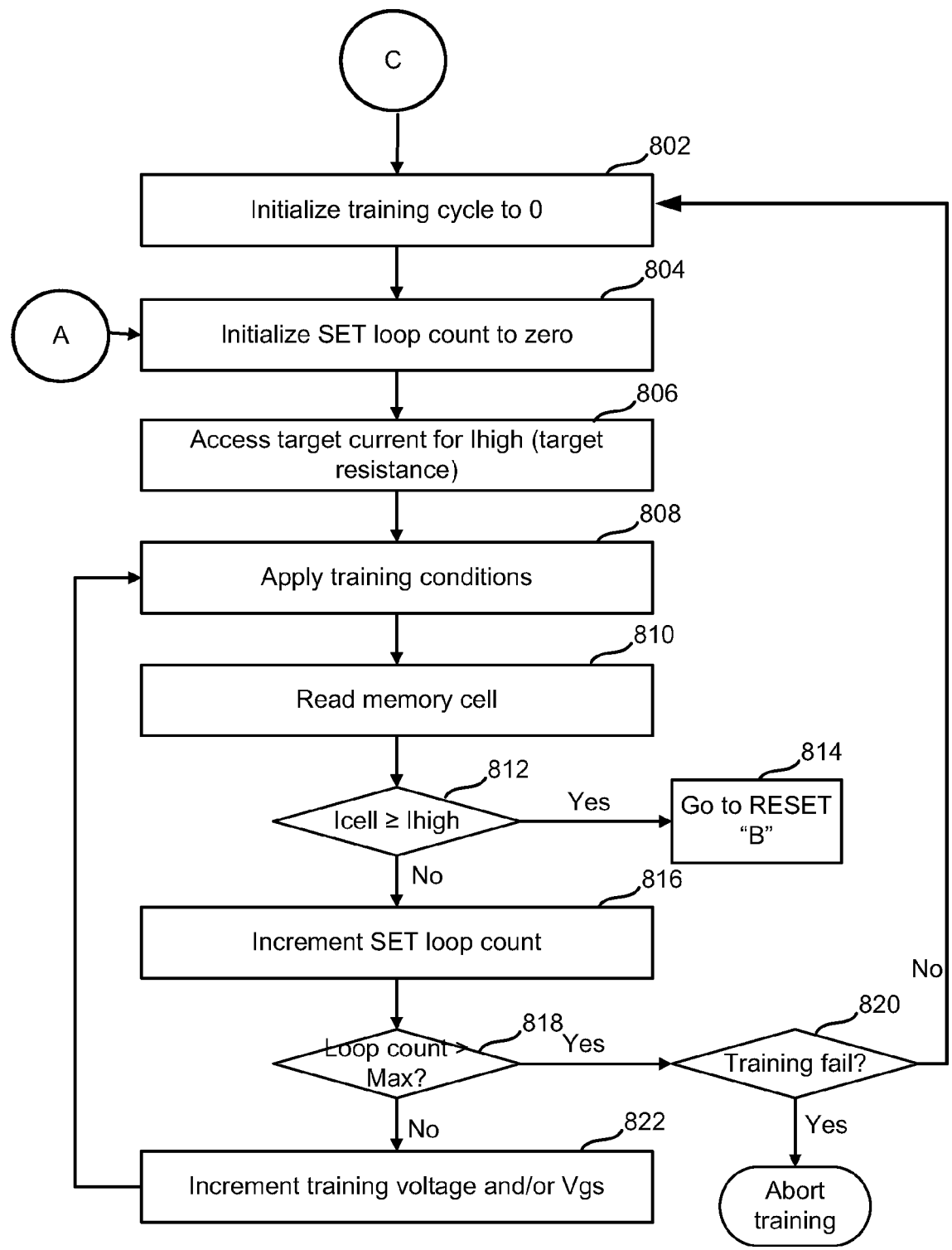
FIG. 8 is a flowchart of one embodiment of the SET step of training the reversible resistance storage element.

FIG. 8 is a flowchart of one embodiment of the SET step of training the reversible resistance storage element 102. This is one embodiment of step 702 of FIG. 7. In step 802, a parameter "training cycle" is initialized to 0. As noted above, a goal of the training process is to have the memory cell 108 cycle between the target SET resistance and the target RESET resistance for some pre-determined number of cycles. This parameter counts those cycles.

In step 804, a SET loop count parameter is initialized to zero. This loop count tracks the number of times that the training voltage is applied to the memory cell 108 to attempt to SET it. If the memory cell 108 does not reach the target SET resistance within the allotted number of attempts, the training process aborts. That is, the training cycle parameter is re-initialized to 0, and the training process is started over.

In step 806, the target current for "I_high" is accessed. In other words, the current that corresponds to the target SET resistance is accessed. This target current will be used to determine whether the memory cell 108 has reached the target SET resistance. As one example, I_high could be about 300 nA.

In step 808, training conditions are applied to the memory cell 108. In one embodiment, step 808 includes applying a gate-to-source voltage to the transistor 106 in the memory cell unit 100. The source line 112 may be grounded, and Vg applied to a word line connected to the gate to achieve the gate-to-source voltage. This may limit the current through the memory cell 108 being trained. At the same time, a training signal may be applied to a selected bit line 116 connected to memory cell 108, which has a reversible resistance storage element 102. The training signal may be a voltage, such as a voltage pulse. Thus, the transistor 106 may limit a current of the reversible resistance storage element 102 that results from applying the training voltage to the selected bit line 116.

Figure 10A:
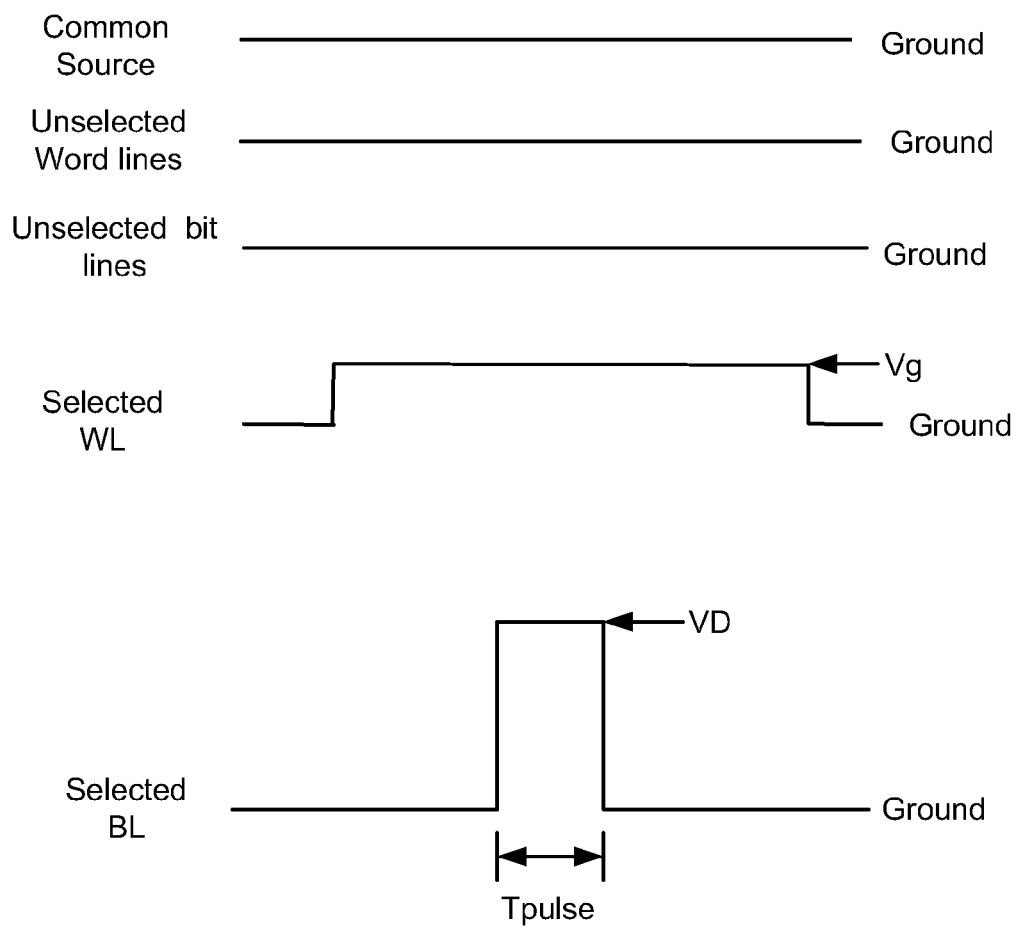
FIG. 10A is an example timing diagram of applying signals that may be used with embodiments.
Figure 10B:
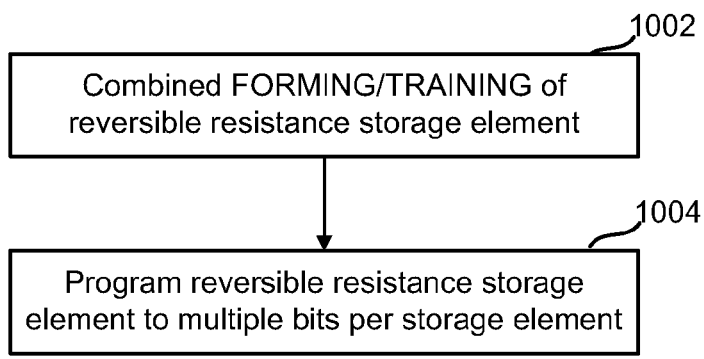
FIG. 10B depicts one embodiment of a flowchart that includes a combined forming/training phase.
Figure 10C:
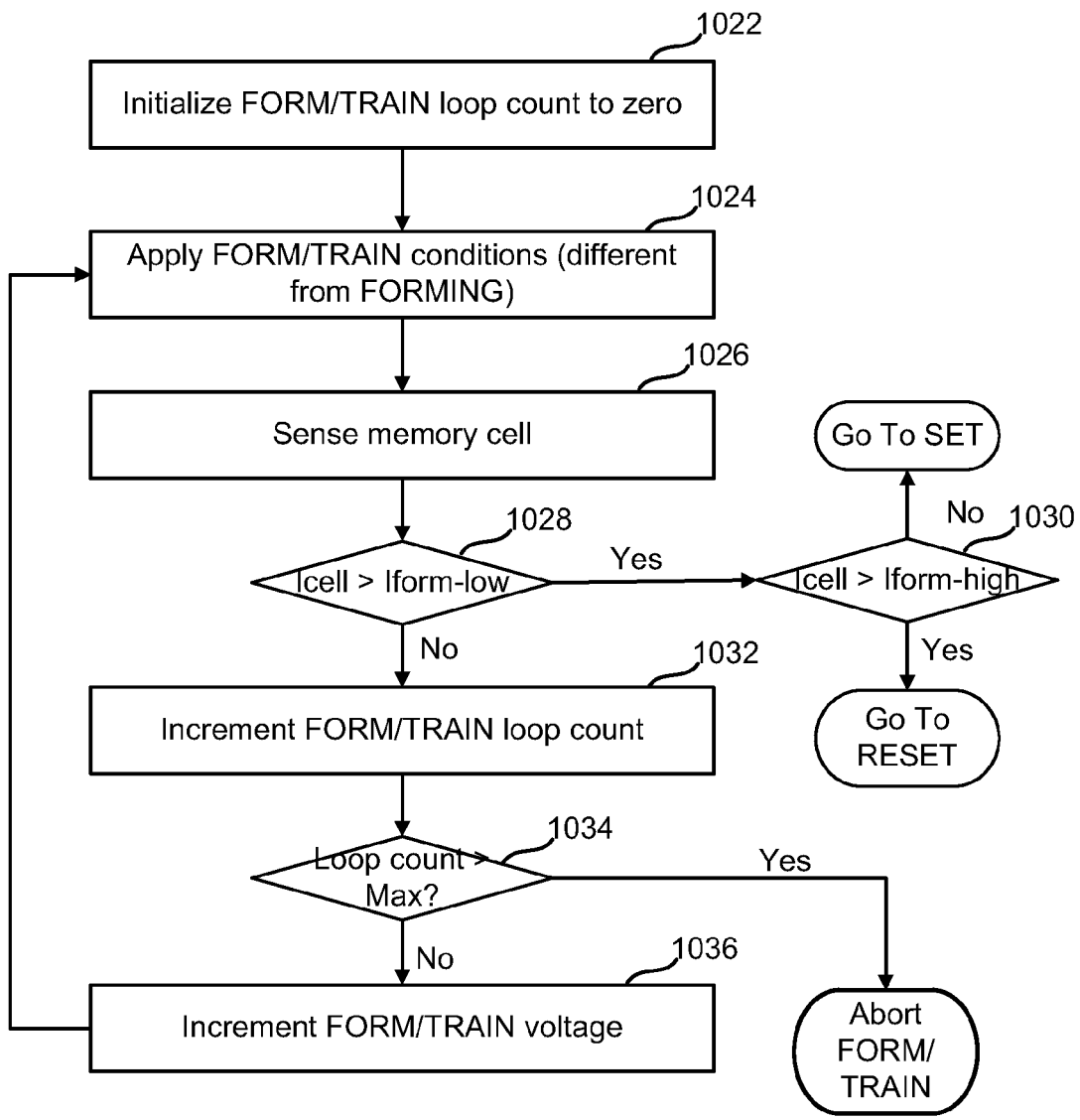
FIG. 10C is a flowchart of one embodiment of the forming phase of a combined forming/training process.

FIG. 10A shows one example of timing of applying signals to bit lines, word lines, and the source line. This diagram will be referred to in order to discussed applying the training conditions. The common source line, unselected word lines, and unselected bit lines are grounded. The selected word line is raised to Vg. Next, the selected bit line is raised to VD for a time periods defined by Tpulse. The selected bit line is then returned to ground. Afterwards, the selected word line may be returned to ground.

Example parameters for step 808 are as follows. Vg may be established at 1.1V, or some other value. The magnitude of Vg may be changed from one loop to the next, but that is optional. The training voltage (selected bit line voltage VD in FIG. 10A) starts at 6.5V for the first loop, as one example. This may be increased in step 822. The pulse width (Tpulse in FIG. 10A) may be $100 \times 10^{-9}$ seconds (100 nanoseconds).

In step 810, the memory cell 108 is read. That is, read conditions are applied to the memory cell 108. Example read conditions are as follows. The bit line associated with the memory cell 108 being read may be set to 1.5V (or another suitable read voltage). The source line may be grounded. The gate of the transistor 106 in the memory unit 100 having the memory cell 108 being read may be set to 4.5V. The body of the transistor 106 may be grounded. In one embodiment, sensing the memory cell 108 is achieved by sensing a current of the source node 404 of the transistor 106. The timing may be similar to that depicted in FIG. 10A, with suitable values for Vg, VD, and Tpulse.

In step 812, a determination is made whether the memory cell 108 is at the target SET resistance. This is achieved by comparing the current of the memory cell 108 that results from applying the read conditions to a target current, in one embodiment. Thus, step 812 may compare the memory cell's current to the current "I_high". As one example, I_high could be about 300 nA. This may be in conjunction with a read voltage of 1.5V, as one example.

If the memory cell's current is greater than or equal to I_high, then the memory cell 108 has been SET and the process goes to the RESET phase, as indicated by step 814. Further details of one embodiment of the RESET phase are discussed in connection with FIG. 9, to be discussed below.

On the other hand, if the memory cell 108 is not yet SET, then the process continues on to step 816, wherein the loop count is incremented. This is the loop count that tracks how many attempts have been made to SET the memory cell 108. If the loop count reaches a maximum allotted count, then the SET phase has failed. This does not mean complete failure in the attempt to train the memory cell 108. Rather, the training process can be re-started by re-turning to step 802. Note that the parameter for the number of training cycles will be re-initialized to zero (step 802) upon re-starting the training process. However, the training process can be aborted if, for example, step 820 has been encountered too many times.

Providing that the SET loop count (step 818) has not reached its maximum allowed number of attempts to SET the memory cell 108, the process continues on to step 822. In step 822, the magnitude of the training voltage and/or Vg is increased. As one example, the magnitude of the training voltage is increased by 0.5V. In one embodiment, there is a maximum allowed SET voltage magnitude. As one example, this is 10V. If this value is reached, the process could continue on without further increases to the voltage. Another possibility is to abort the process if memory cell 108 does not SET by this stage. Thus, note that rather than using the loop count in step 816-818, the system could halt the process after the maximum voltage has been reached.

In one embodiment, Vgs is incremented by a small amount in step 822, but the training voltage is not changed. In one embodiment, Vgs is incremented by a small amount and the training voltage is also incremented in step 822. Note that some types of memory cells 108 may be considered to be current controlled devices (as opposed to voltage controlled devices). Changing Vgs from one loop to the next changes a current limit for the memory cell 108. Changing Vgs may also help to cycle a memory cell 108 in a pure current controlled mode, with fixed training voltage.

Also, note that the magnitude of the training voltage does not need to be increased with each iteration. Other schemes might be used to alter the training voltage from one loop to the next. The process then returns to step 808 to apply the training conditions. This concludes the description of the SET phase.

Figure 9:
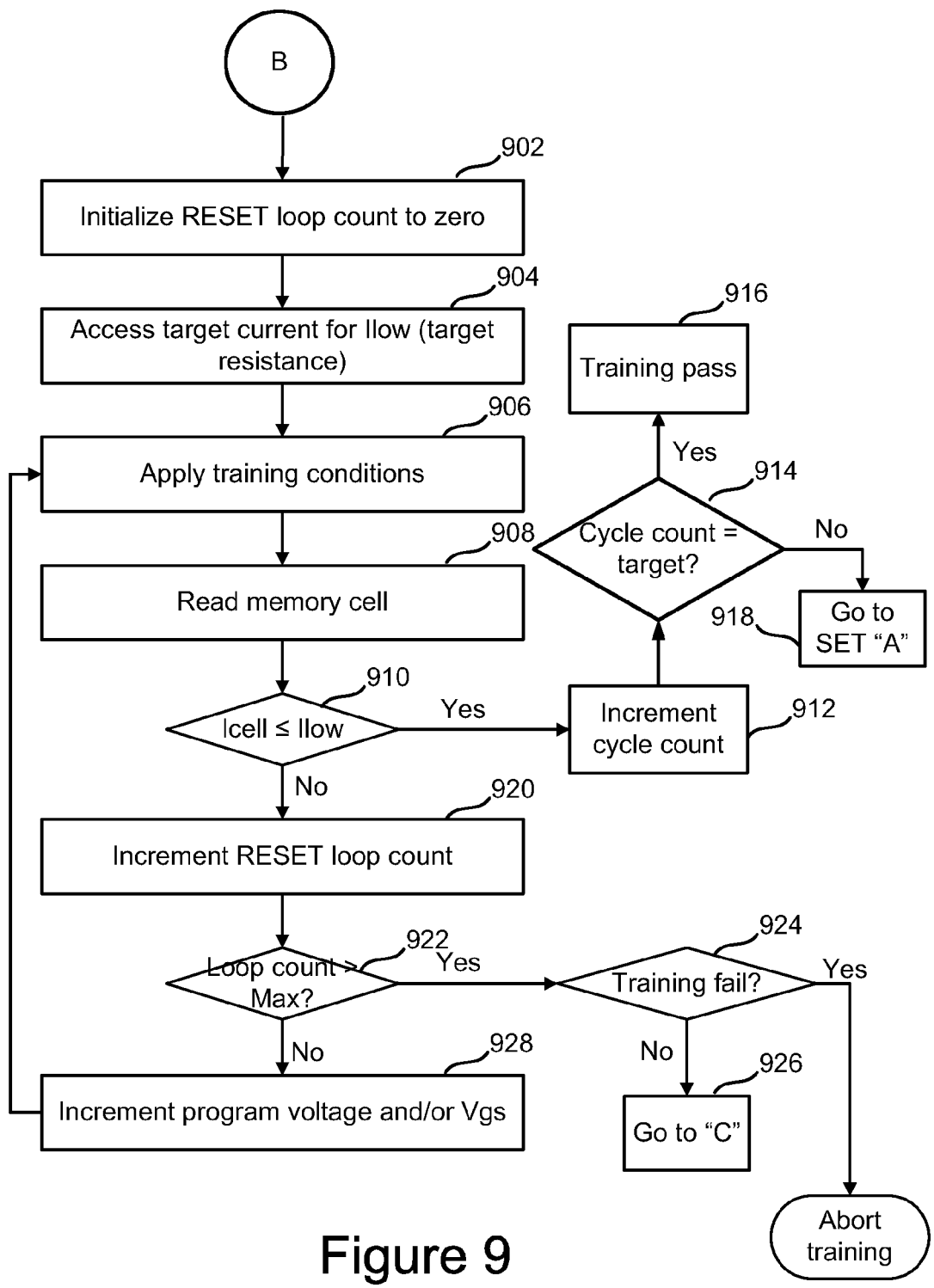
FIG. 9 is a flowchart of one embodiment of the RESET step of training the reversible resistance storage element.

FIG. 9 is a flowchart of one embodiment of the RESET step of training the reversible resistance storage element 102. This is one embodiment of step 704 of FIG. 7. As noted in the description of FIG. 8, the RESET phase may be performed after step 814. In step 902, a RESET loop count parameter is initialized to zero. This RESET loop count tracks the number of times that the training voltage is applied to the memory cell 108 to attempt to RESET it. If the memory cell 108 does not reach the target RESET resistance within the allotted number of attempts, the training process aborts. That is, the training cycle parameter is re-initialized to 0, and the training process is started over.

In step 904, the target current for "I_low" is accessed. In other words, the current that corresponds to the target RESET resistance is accessed. This target current will be used to determine whether the memory cell 108 has reached the target RESET resistance. As one example, I_low could be about $100 \times 10^{-9}$ amperes (100 nA).

In step 906, training conditions are applied to the memory cell 108. In one embodiment, step 906 includes applying a gate-to-source voltage to the transistor 106 in the memory cell unit 100. The source line 112 may be grounded, and Vg applied to a word line connected to the gate to achieve the gate-to-source voltage. This may limit the current through the memory cell 108 being trained. At the same time, a training signal may be applied to a selected bit line 116 connected to memory cell 108, which has a reversible resistance storage element 102. The training signal may be a voltage, such as a voltage pulse. Thus, the transistor 106 may limit a current of the reversible resistance storage element 102 that results from applying the training voltage to the selected bit line 116.

Example parameters for step 906 are as follows. Vg may be established at between about 1.1V to 1.5V, as an example. However, Vg might be higher or lower. A higher Vg may be used to allow the current limit to be greater. In one embodiment, Vg is incremented with each (or at least some) program loop. The training voltage starts at 5V for the first loop, as one example. This may be increased in step 928. The pulse width may be $100 \times 10^{-9}$ seconds (100 nanoseconds). The timing of applying the training signals may be similar to that depicted in FIG. 10, with suitable values for Vg, VD, and Tpulse.

In step 908, the memory cell 108 is read. That is, read conditions are applied to the memory cell 108. Example read conditions are as follows. The bit line associated with the memory cell 108 being read may be set to 1.5V (or another suitable read voltage). The source line may be grounded. The gate of the transistor 106 in the memory unit 100 having the memory cell 108 being read may be set to 4.5V. The body of the transistor 106 may be grounded. In one embodiment, sensing the memory cell 108 is achieved by sensing a current of the source node of the transistor 106.

In step 910, a determination is made whether the memory cell 108 is at the target RESET resistance. This is achieved by comparing the current of the memory cell 108 that results from applying the read conditions to the target I_low current, in one embodiment. As one example, I_low could be about $100 \times 10^{-9}$ amperes (100 nA). This may be in conjunction with a read voltage of 1.5V.

If the memory cell's current is less than or equal to I_low, then the memory cell 108 has been RESET. As a result, the process increments the cycle count in step 912. Recall that the cycle count was first established in step 802 of the SET process. In step 914, a determination is made whether the cycle count has reached the target number of training cycles. If so, the training process has passed, as indicated by step 916. This means that the memory cell 108 has successfully cycled between SET and RESET for the target number of cycles.

On the other hand, if the cycle count has not yet reached the target number of training cycles, then the SET phase is returned to. This is indicated by step 918, which reads "go to SET A". Returning briefly to the discussion of FIG. 8, note that "A" returns to step 804. Thus, the SET phase is started again. However, the training cycle count is not re-initialized (step 802 not performed).

Returning now again to the discussion of FIG. 9, another possible outcome of step 910 is that the memory cell 108 has not yet reached the target resistance for RESET. For example, the memory cell 108 current during read is greater than I_low. In this case, the process continues on to step 920, wherein the RESET loop count is incremented. If the RESET loop count reaches a maximum allotted count, then the RESET phase has failed. The process continues at step 924 to determine whether the overall training process has failed. This may be the case if there have been too many attempts to RESET. However, failure of the RESET phase does not mean complete failure in the attempt to train the memory cell 108. Rather, the training process can be re-started. This is indicated by step 926 that goes to "C". Note that "C" is the entry point to step 802 of FIG. 8. Note that the parameter for the number of training cycles will be re-initialized to zero (step 802) upon re-starting the training process.

Providing that the RESET loop count (step 922) has not reached its maximum allowed number of attempts to RESET the memory cell 108, the process continues on to step 928. In step 928, the magnitude of the training voltage and/or Vgs is increased. As one example, the magnitude of the training voltage is increased by 0.5V. In one embodiment, there is a maximum allowed RESET voltage. As one example, this is 10V. If this value is reached, the process could continue on without further increases to the voltage. Another possibility is to abort the process if memory cell 108 does not RESET by this stage. Thus, note that rather than using the loop count, the system could halt the process after the maximum voltage has been reached.

Note that the magnitude of the training voltage does not need to be increased with each iteration. Other schemes might be used to alter the program conditions from one loop to the next. In one embodiment, Vgs is incremented by a small amount, but the training voltage is not changed. In one embodiment, Vgs is incremented by a small amount and the training voltage is also incremented. The process then returns to step 906 to apply the training conditions. This concludes the description of the RESET phase.

As noted above, one embodiment includes a combined forming/training phase. Note that FORMING and SET both serve to lower the memory cell 108 resistance, in one embodiment. However, these operations may have different target resistances. Also, FORMING is typically applied to a virgin memory cell 108. Note that the resistance of the memory cell 108 in the virgin state may be considerably higher than the typical resistance for the SET state.

FIG. 10B depicts one embodiment of a flowchart that includes a combined forming/training process. In step 1002, a combined forming/training process is performed. This step may provide for a faster and simplified test flow, as compared to the process of FIG. 6A, which has separate processes for forming and training. Further details of one embodiment are discussed in connection with FIG. 10C.

Step 1004 is to program the reversible resistance storage elements to multiple bits per storage element. This step may be similar to step 606 of FIG. 6A.

FIG. 10C is a flowchart of one embodiment of the forming phase of a combined forming/training process. This may be used in step 1002 of FIG. 10B. In step 1022, a loop count is initialized. In step 1024, conditions are applied for the forming phase of the combined forming/training process. Note that these conditions may be different from those used in the FORMING process of FIG. 6B. In step 1024, the voltage pulse that is applied to the selected bit line could be shorter in duration than the FORMING voltage that is used in the FORMING process of FIG. 6B.

The voltage that is applied to the memory cell in this process will be referred to as an "integrated forming" voltage, as this process combines forming with training. The integrated forming voltage may be applied to the bit line 116 associated with the memory cell 108, while the source line is grounded. Also, a voltage is applied to the word line 114 associated with the memory cell 108 such that the transistor 106 associated with the memory cell 108 is turned on. In one embodiment, a packet of voltage pulses are used.

Example parameters for step 1024 are as follows. The Vgs of the transistor 106 may be about 0.8V. This may be achieved by grounding the common source line 112 and applying a suitable voltage to the word line 114 associated with the memory cell unit 100 having the memory cell 108 being formed. The initial integrated forming voltage (which may be applied to the bit line 116) may be in the range of 4 to 9 V, increasing by 0.2V with each iteration. A different initial integrated forming voltage and increment may be used. The integrated forming voltage has a pulse width that is less than that used for the FORMING process of FIG. 6B, in one embodiment. Other parameters may be used for FORMING.

In step 1026, the memory cell 108 is sensed. Thus, after applying the integrated FORMING voltage, the memory cell 108 is sensed to determine whether its resistance has been decreased to the target FORMING resistance. Sensing the memory cell 108 determines the memory cell's current, in one embodiment. In one embodiment, a read reference voltage is applied to the bit line 116 associated with the memory cell 108. In one embodiment, the current of the memory cell 108 that results from applying the read reference voltage is sensed and compared to a reference current. An example reference current for Iform_low is 10 nA. A different value could be used.

In step 1028, the memory cell's current is compared to a target FORMING current, Iform_low. If the memory cell's current (and hence resistance) has reached the target level, then the process goes to step 1030 to compare the memory cell current to a high FORMING reference level, Iform_high. As one example, Iform_high is 100 nA. Iform_high could be about the same magnitude as the reference current used to determine whether the memory cell has been RESET in the RESET portion of the training operation, as depicted in step 910 of FIG. 9. However, this correspondence is not required.

If the memory cell current is relatively low (e.g., between Iform_low and Iform_high), then the memory cell should be SET. That is, its resistance should be lowered. Thus, the process continues on to a SET procedure. Thus, a process similar to the SET process of FIG. 8 could be performed. After the SET process, a RESET process, such as depicted in FIG. 9 may be performed. The SET and RESET processes can be alternated for some desired number of cycles as discussed with respect to the training operation.

If the memory cell current is relatively high (e.g., greater than Iform_high), then the memory cell should be RESET. That is, its resistance should be increased. Thus, the process continues on to a RESET procedure. Thus, a process similar to the RESET process of FIG. 9 could be performed. Note that this means that the process starts directly with the RESET process after initially reaching the forming target level. Thus, the SET process may be skipped the first cycle. After the RESET process, a SET process, such as depicted in FIG. 8 may be performed. The SET and RESET processes can be alternated for some desired number of cycles as discussed with respect to the training operation.

In step 1032, the FORM/TRAIN loop count is incremented. In step 1034, the loop count is compared to a maximum allowed loop count. If the loop count exceeds a maximum, then the process aborts. One option is to flag the memory cell 108 such that it is not used. However, another option is to make further attempts to FORM the memory cell 108.

Assuming the loop count has not yet reached the maximum, the integrated FORMING voltage is incremented in step 1036. The process then goes to step 1024 to apply the FORM/TRAIN conditions. Thus, additional integrated FORMING voltages may be applied until the resistance is reduced to the target FORMING resistance. As noted, the integrated FORMING voltage is increased in magnitude between one loop and the next, in one embodiment. However, the integrated FORMING voltage is not required to be increased with each iteration. For example, the integrated FORMING voltage might be increased for some iterations, but kept the same for others. Also a different step size (e.g., different voltage increment) could be used for different iterations.

Figure 11A:
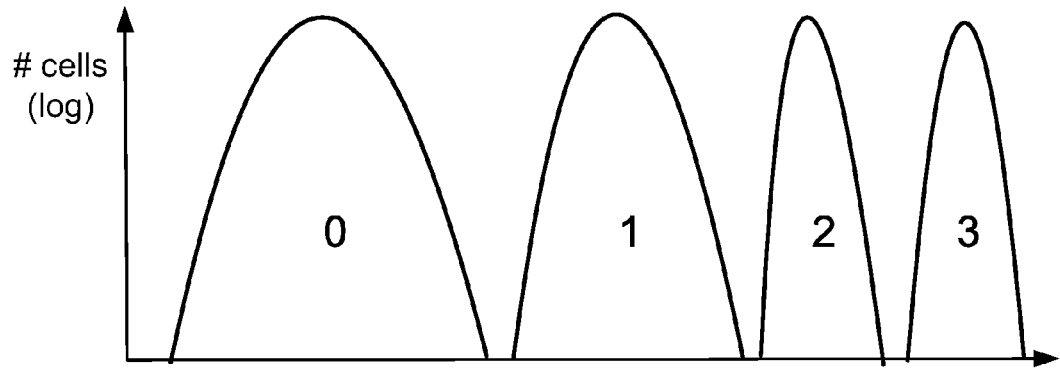
FIG. 11A shows example current distributions for four data states, in accordance with one embodiment.

Note that for the FORMING process of FIG. 6B, a longer FORMING pulse with a smaller increment may be used (relative to the integrated FORMING pulse of FIG. 10C). This may allow for better control over the resistance of the memory cell during FORMING. For the integrated forming/training, the control over the memory cell resistance may not be as good. However, the test at step 1030 allows for the process to determine whether a SET or RESET should be performed. Thus, a problem with "over-setting" a memory cell 108 can be avoided. In one embodiment, the memory cells 108 are programmed to multiple bits per memory cell 108. As one example, four data states are used. FIG. 11A shows example current distributions for four data states, in accordance with one embodiment. The graph depicts Icell (log) versus the number of cells (log). The four data states are labeled "0", "1", "2", and "3". In this example, state 0 corresponds to the lowest current state, which is the highest resistance state. In this example, state 3 corresponds to the highest current state, which is the lowest resistance state. In one embodiment, unipolar operation is used in connection with multiple bits per cell.

Herein, a SET operation is defined as lowering the resistance of the memory cell 108. Hence, a SET operation moves the memory cell 108 from its present data state to a higher numbered data state, in this example. Conversely, herein, a RESET operation is defined as increasing the resistance of the memory cell 108. Hence, a RESET operation moves the memory cell 108 from its present data state to a lower numbered data state, in this example.

In one embodiment, a memory cell 108 can be programmed directly from its present data state to any of the other data states. For example, a memory cell 108 can be SET from state 0 directly to state 2. Note that this skips state 1. As another example, a memory cell 108 can be SET from state 0 directly to state 3. Note that this skips states 1 and 2. As still another example, a memory cell 108 can be SET from state 1 directly to state 3. Note that this skips state 2. These are all example of SETTING directly to a state that is at least two data states away from the present data state.

Figure 11B:
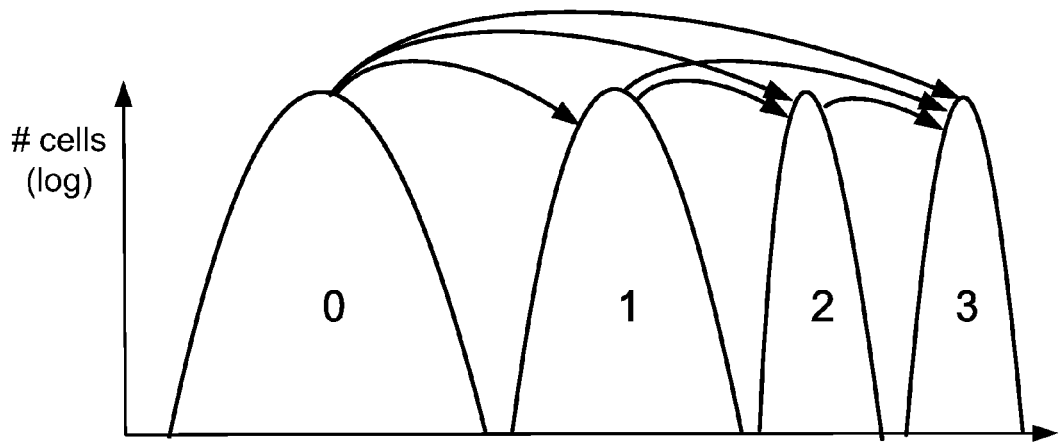
FIG. 11B is a diagram showing example current distributions used to illustrate one embodiment of SET.

The foregoing is represented in FIG. 11B with respect to SET operations. FIG. 11B shows that a memory cell 108 can be SET from state 0 directly to any of the other states. In one embodiment, a different group of program conditions are used when SETTING directly from state 0 to state 2 (skipping state 1), as compared to program conditions for SETTING from state 0 to state 1 and then from state 1 to state 2. For example, the pulse width of the SET voltage may be longer when going directly from state 0 to state 2, than for going from state 0 to state 1. It is also possible for the initial SET voltage to have a greater magnitude when going directly from state 0 to state 2, than for going from state 0 to state 1. There may be other differences also.

Likewise, a different set of program conditions may be used when SETTING directly to state 3 (skipping states 1 and 2), as compared to the program conditions for SETTING from state 0 to state 1, then to state 2, and finally to state 3. For example, the pulse width of the SET voltage may be longer when going directly from state 0 to state 3, as compared to the pulse width for going from state 0 to state 1. Also, the pulse width going directly to state 3 may be longer than the pulse width going from state 1 to state 2. It is also possible for the magnitude of the SET voltage to be different when skipping a state. For example, the initial SET voltage may have a greater magnitude when going directly to state 3, compared to the magnitude of the initial SET voltage for going from state 0 to state 1.

Also note that a memory cell 108 in state 1 may be SET to state 2 or directly to state 3 (skipping state 2). In one embodiment, a different set of program conditions are used when SETTING directly from state 1 to state 3 (skipping state 2), compared to SETTING from state 1 to state 2 and then to state 3. For example, the pulse width of the SET voltage may be longer when going directly from state 1 to state 3, than for going from state 1 to state 2. It is also possible for the initial SET voltage to have a greater magnitude when going directly from state 1 to state 3, than for going to from state 1 to state 2.

In one embodiment, the program conditions are dependent on the state to which the memory cell 108 is being directly SET. For example, a first group of program conditions may be used when SETTING to state 1. A second group of program conditions may be used when SETTING directly to state 2, regardless of which state the memory cell 108 is presently in. A third group of program conditions may be used when SETTING directly to state 3, regardless of which state the memory cell 108 is presently in. In one embodiment, the pulse width of the SET voltage depends on the state to which the memory cell 108 is being directly SET. Further details are discussed below.

Figure 11C:
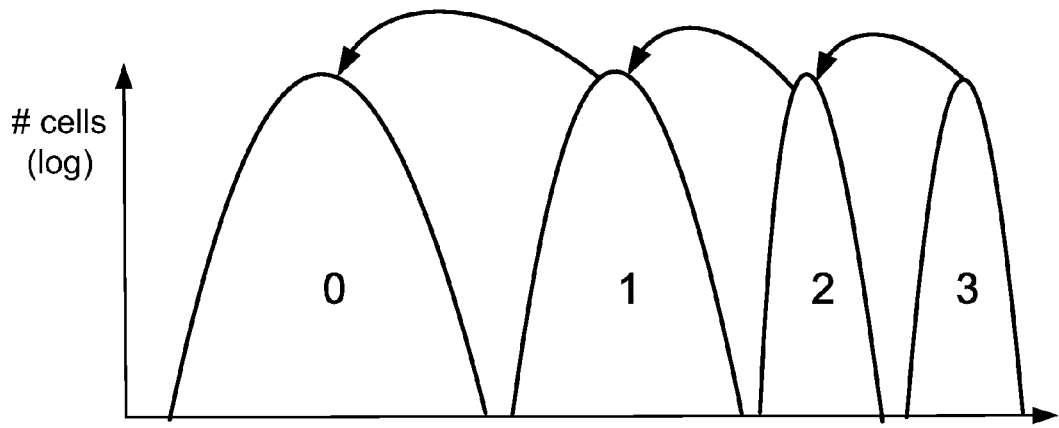
FIG. 11C is a diagram showing example current distributions used to illustrate one embodiment of RESET.

A memory cell 108 may be RESET one state at a time, in one embodiment. This avoids the need to have to RESET all that way to state 0 and then SET to achieve a desired state. FIG. 11C is a diagram used to illustrate one embodiment of RESET. A memory cell 108 in state 3 may be RESET directly to state 2. This is in contrast to techniques that need to RESET the memory cell 108 from state 3 to state 0, and then to SET it to state 2. Similarly, a memory cell 108 in state 2 may be RESET directly to state 1. This is in contrast to techniques that need to RESET the memory cell from state 2 to state 0, and then to SET it from state 0 to state 1.

Note that different program conditions may be used when RESETTING to the different states. For example, a first group of program conditions may be used when RESETTING from state 3 to state 2; a second group of program conditions may be used when RESETTING from state 2 to state 1; a third group of program conditions may be used when RESETTING from state 1 to state 0. In one embodiment, the initial RESET voltage is lower in magnitude when RESETTING to lower states. For example, in Table IV below, VD_low is 5.5V when RESETTING from state 3 to state 2.

However, in Table V below, VD_low is 3.4V when RESETTING from state 2 to state 1. Further details are discussed below.

Figure 12:
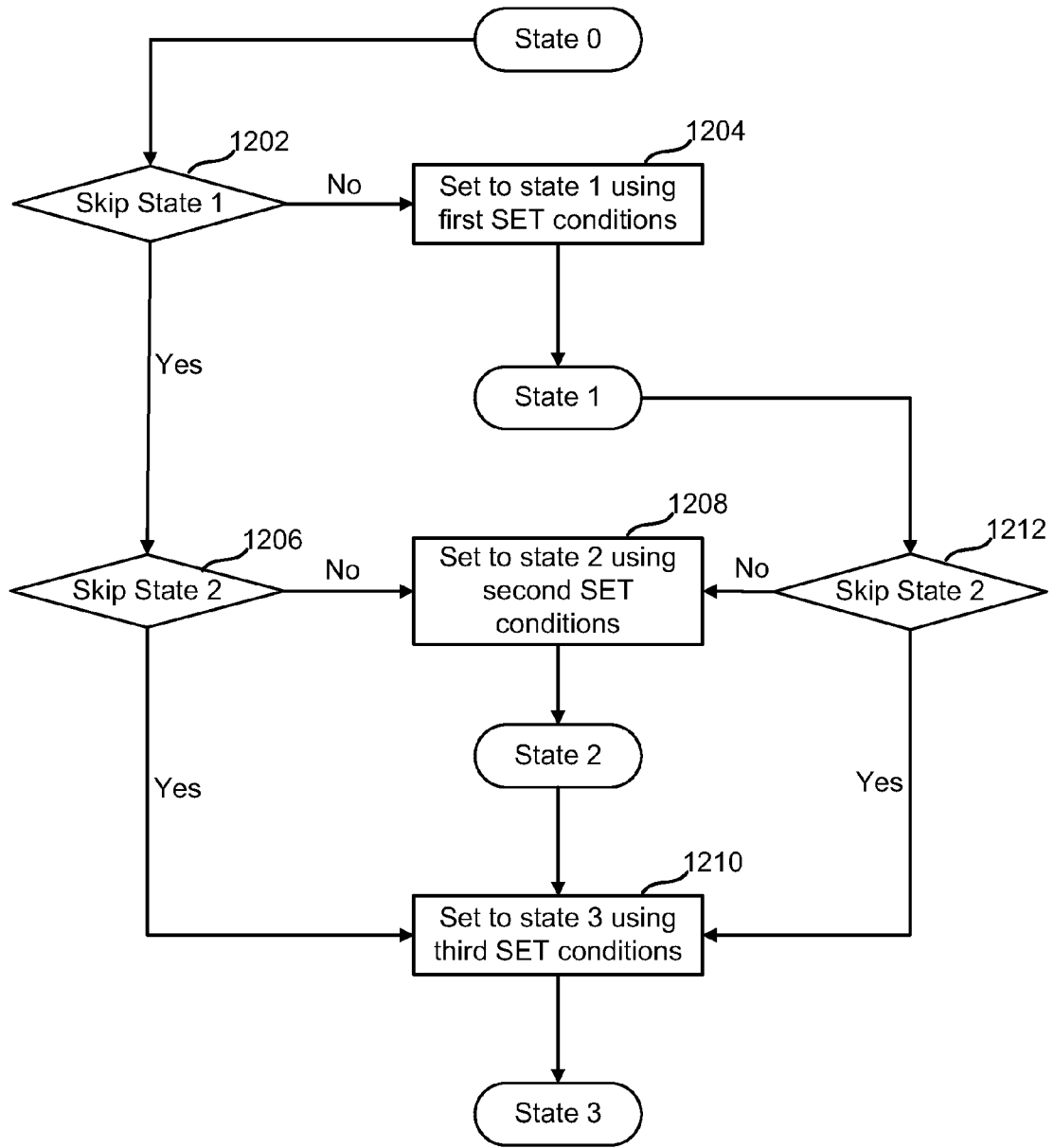
FIG. 12 is a flowchart of one embodiment of a process of SETTING a memory cell, in which the memory cell may store multiple bits.

FIG. 12 is a flowchart of one embodiment of a process of SETTING a memory cell, in which the memory cell 108 may store multiple bits. In this example, the memory cell 108 is SET to one of four different data states. In this process, the memory cell 108 may be SET directly to a data state that is at least two data states away. In other words, an intervening data state may be skipped. Also, the conditions that are applied to the memory cell 108 may depend on the state to which the memory cell 108 is being SET.

If a memory cell 108 is in state 0 it may be SET directly to any of states 1, 2, or 3, as follows. Step 1202 tests whether state 1 should be skipped. If not, the memory cell is SET to state 1 using first SET conditions, in step 1204.

In one embodiment, the first SET conditions are as described in Table I.

TABLE I

| Vg | VD_Low | VD_High | VD step | VD PW | I_V_Low | I_V_High |
|---|---|---|---|---|---|---|
| 0.8 V | 6.5 V | 10 V | 0.5 V | 100 ns | 100 nA | 250 nA |

In Table I, Vg is the voltage applied to the gate of the transistor 106 of the memory cell unit 100. VD_Low is the initial value of the SET voltage that is applied to the bit line 116 associated with the memory cell 108 being SET. VD_High is the maximum value of the SET voltage that is applied to the bit line 116 associated with the memory cell 108 being SET. VD_step is the step size of VD from one loop to the next. VP_PW is the pulse width of VD. I_Ver_Low and I_Ver_High are examples of low and high verify currents for determining whether the memory cell 108 is in the proper resistance range for data state 1.

If state 1 is to be skipped (step 1202=yes), then step 1210 is performed to determine whether state 2 should be skipped. If not, then the memory cell 108 is set directly from state 0 to state 2 using second SET conditions in step 1208. Note that the second SET conditions that are applied in step 1208 are different from those of step 1204, in one embodiment. This allows for the SET conditions to depend on the data state to which the memory cell 108 is being SET. In one embodiment, the second SET conditions are as described in Table II.

TABLE II

| Vg | VD_Low | VD_High | VD step | VD PW | I Ver_Low | I_Ver_High |
|---|---|---|---|---|---|---|
| 0.8 V | 7.5 V | 10 V | 0.5 V | 200 ns | 300 nA | 450 nA |

Returning now to step 1206, if state 2 is to be skipped (step 1206=yes), then the memory cell 108 is SET directly from state 0 to state 3 using third SET conditions, in step 1210. Note that the third SET conditions that are applied in step 1210 are different from those of steps 1204 and 1208, in one embodiment. This also allows for the SET conditions to depend on the data state to which the memory cell 108 is being SET. In one embodiment, the third SET conditions are as described in Table III.

TABLE III

| Vg | VD_Low | VD_High | VD step | VD PW | I Ver_Low | I_Ver_High |
|---|---|---|---|---|---|---|
| 0.8 V | 7.5 V | 10 V | 0.5 V | 400 ns | 600 nA | 1000 nA |

Note that in one embodiment, there is not an I_Ver_High for data state 3, as it may not be necessary to determine whether the current is too high, assuming this is the highest data state. However, an I_Ver_High can be used for the highest data state, as this can provide for tighter Icell control, which in turn may provide better endurance.

In one embodiment, the rise time for the SET pulse is between about 20 ns-50 ns. Likewise, the fall time for the SET pulse may be between about 20 ns-50 ns. However, each may be longer or shorter. This may apply to any of Tables I-III.

The foregoing has described how a memory cell 108 may be SET from state 0 to any of the other data states. It also has described how the memory cell 108 may be SET directly from state 0 to either state 2 or 3, while skipping intervening data states.

Next, SETTING from state 1 to either state 2 or state 3 will be discussed. For a memory cell 108 in state 1, step 1212 is performed to determine whether state 2 should be skipped. If not, then the memory cell 108 is SET to state 2 using the second SET conditions in step 1208.

Otherwise, the memory cell 108 is SET directly from state 1 to state 3 using the third SET conditions in step 1210. The foregoing has described how a memory cell 108 may be SET from state 1 to either data state 2 or 3. It also has described how the memory cell 108 may be SET directly from state 1 to state 3, while skipping intervening data state 2.

Next, SETTING from state 2 to data state 3 will be discussed. For a memory cell 108 in state 2, step 1210 is performed to apply the third SET conditions to SET the memory cell 108 to state 3.

Note that the conditions for SETTING include verify currents. One aspect of skipping a data state is that the system simply tests for the verify current to which the memory cell is being SET. For example, when skipping state 1 (e.g., going directly from state 0 to state 2), the system simply tests for verify currents associated with state 2.

As noted in the description of FIG. 12, the values in Tables I-III are for purposes of illustration. Some of the values may depend on the characteristics of the memory cell 108. For example, the type of non-linear element 104 being used may have an impact on the magnitude of the bit line voltage (Vd). For example, the type of reversible resistance element 102 being used may have an impact on the magnitude of the bit line voltage (Vd) and/or the pulse width. The values for Vg may depend on characteristics of the transistor 106. However, some things can be taken away about the relative differences between one group of SET conditions and another.

In one embodiment, the programming conditions employ higher energy levels for higher current states. In one embodiment, the programming algorithm uses SET voltage level, voltage level increment and pulse width such that a higher energy level is associated with the higher current level states being SET. For the sake of illustration, the programming conditions in Table I (for Setting to state 1), Table II (for Setting to state 2), and Table III (for Setting to state 3) will be discussed. As noted above, the values in Tables I-III are examples.

For example, comparing the values from Table I and Table II, Table I has a first initial voltage level (VD_Low of 6.5V), a first voltage increment (VD_Step of 0.5V), and a first pulse width (VD PW=100 ns) that are associated with a first energy level. Table II has a second initial voltage level (VD_Low of 7.5V), a second voltage increment (VD_Step of 0.5V), and a second pulse width (VD PW=200 ns) that are associated with a second energy level. The second energy level is a higher energy level, as Table II is associated with a higher current state than Table I. The energy level is a function of the pulse width and pulse magnitude, in one embodiment.

Similar observations can be made by comparing Table III and Table II (Table III being associated with a higher current state and a higher energy level. For Table III, the pulse width is greater than for Table II.

Similar observations can be made by comparing Table I and Table III (Table III being associated with a higher current state and a higher energy level. In this case, the pulse width is greater for Table III and the initial pulse magnitude is greater.

Figure 13:
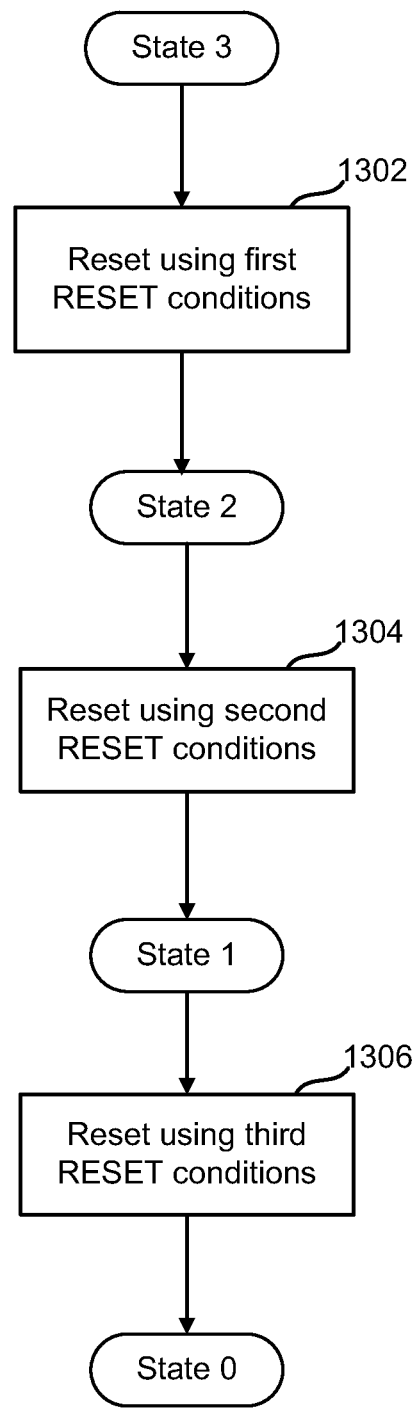
FIG. 13 is a flowchart of one embodiment of a process of RESETTING a memory cell, in which the memory cell may store multiple bits.

FIG. 13 is a flowchart of one embodiment of a process of RESETTING a memory cell, in which the memory cell 108 may store multiple bits. In this example, the memory cell 108 is RESET to one of four different data states. In this process, the memory cell 108 may be RESET directly from its present data state to the state one below (e.g., to the state having greater resistance). In other words, an intervening data state does not need to be skipped. Also, the conditions that are applied to the memory cell 108 may depend on the state from which the memory cell 108 is being RESET. In the discussion of FIG. 13, three groups of RESET conditions will be discussed.

If a memory cell 108 is in state 3 it may be RESET directly to state 2. This is in contrast to techniques that need to RESET the memory cell 108 all the way to state 0, and then to SET it to state 2. In one embodiment, a first group of RESET conditions are used to RESET directly from state 3 to state 2. In one embodiment, the first RESET conditions are as described in Table IV.

TABLE IV

| Vg | VD_Low | VD_High | VD step | VD PW | I_Ver_High | I_Ver_Low |
|---|---|---|---|---|---|---|
| 0.8 V | 5.5 V | 7.5 V | 0.2 V | 100 ns | 600 nA | 300 nA |

In Table IV, Vg is the voltage applied to the gate of the transistor 106 of the memory cell unit 100. VD_Low is the initial value of the RESET voltage that is applied to the bit line 116 associated with the memory cell 108 being RESET. VD_High is the maximum value of the RESET voltage that is applied to the bit line 116 associated with the memory cell 108 being RESET. VD_step is the step size of VD from one loop to the next. VP_PW is the pulse width of VD. I_Ver_High and I_Ver_Low are used to determine whether the current (as well as resistance) of the memory cell 108 is in the target range for data state 2. The above values are just examples. The value for Vg could be greater or smaller. For example, Vg might be closer to 1.0V. Another example step size is 0.5V.

If a memory cell 108 is in state 2 it may be RESET directly to state 1. This is in contrast to techniques that need to RESET the memory cell 108 all the way to state 0, and then to SET it to state 1. In one embodiment, a second group of RESET conditions are used to RESET directly from state 2 to state 1. In one embodiment, the second RESET conditions are as described in Table V.

TABLE V

| Vg | VD_Low | VD_High | VD step | VD PW | I_Ver_High | I_Ver_Low |
|---|---|---|---|---|---|---|
| 0.8 V | 3.4 V | 7 V | 0.2 V | 100 ns | 250 nA | 100 nA |

Note that the second RESET conditions that are applied in step 1304 are different from those of step 1302, in one embodiment. This also allows for the RESET conditions to depend on the data state from which the memory cell 108 is being RESET. A difference between the first and second RESET conditions is that VD_Low (the initial RESET voltage) is lower for the second RESET conditions. The pulse width is the same in this example. However, the pulse widths could be different. As one example, the pulse width for the second RESET conditions might be shorter than the first RESET conditions.

If a memory cell 108 is in state 1 it may be RESET directly to state 0. In one embodiment, a third group of RESET conditions are used to RESET from state 1 to state 0. In one embodiment, the third RESET conditions are as described in Table VI.

TABLE VI

| Vg | VD_Low | VD_High | VD step | VD PW | I_Ver_High |
|---|---|---|---|---|---|
| 0.8 V | 3.4 V | 6.4 V | 0.2 V | 100 ns | 50 nA |

In the values in Table VI, there is an I_Ver_High, but not an I_Ver_Low. This is because this is the lowest data state (corresponding to lowest current or highest resistance). Therefore, it may not be necessary to test for an I_Ver_Low. A difference between the second and third RESET conditions is that VD_High (the maximum RESET voltage) is lower for the third RESET conditions. The pulse width is the same in this example. However, the pulse widths could be different. As one example, the pulse width for the third RESET conditions might be shorter than the second RESET conditions.

In one embodiment, the rise time for the RESET pulse is between about 20 ns-50 ns. Likewise, the fall time for the RESET pulse may be between about 20 ns-50 ns. However, each may be longer or shorter. This may apply to any of Tables IV-VI.

As noted in the description of FIG. 13, the values in Tables IV-VI are for purposes of illustration. Some of the values may depend on the characteristics of the memory cell 108. For example, the type of non-linear element 104 being used may have an impact on the magnitude of the bit line voltage (Vd). For example, the type of reversible resistance element 102 being used may have an impact on the magnitude of the bit line voltage (Vd) and/or the pulse width. The values for Vg may depend on characteristics of the transistor 106.

As noted above, the programming conditions may employ higher energy levels for higher current states. In one embodiment, the programming algorithm uses RESET voltage level, RESET voltage level increment and RESET pulse width such that a higher energy level is associated with the higher current level states being RESET.

Figure 14:
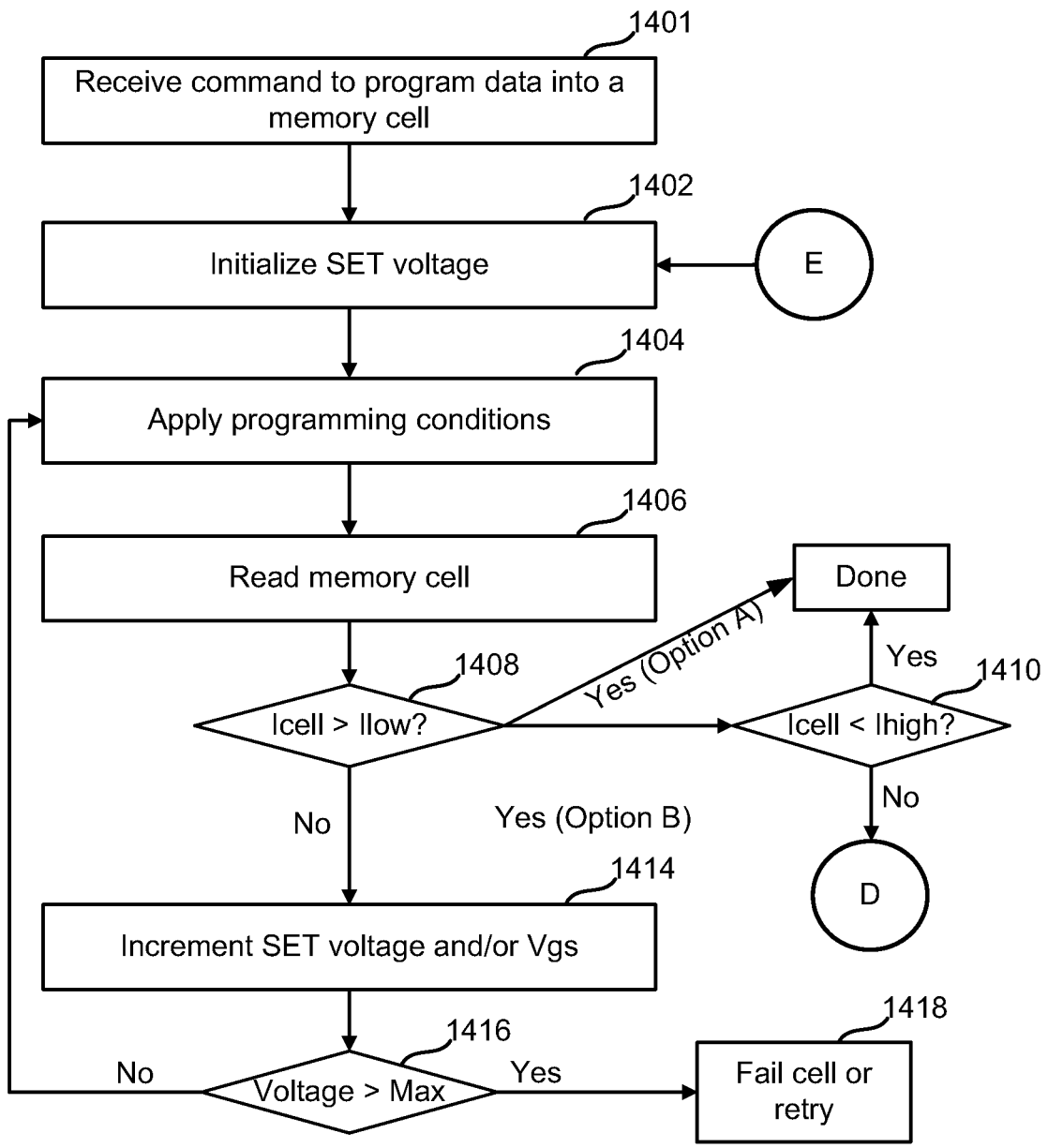
FIG. 14 provides further details for SETTING a memory cell, in accordance with one embodiment.

FIG. 14 provides further details for SETTING a memory cell 108, in accordance with one embodiment. This process could be used for any of steps 1204, 1208 or 1210 in FIG. 12. In step 1401 a command is received to program data into a memory cell 108. In one embodiment, the host 31 sends a request to the controller 25 to store data in the memory cell array 300 to initiate the data storage process. The controller 25 may send a command and/or data on to other circuitry such as the decoder/driver 37 to cause the data to be stored in the memory cell array 300. In one embodiment, a determination is made of the present state of the memory cell 108, such that it is determined that the memory cell 108 is to be SET in order to program the data into the memory cell 108.

In step 1402, the initial value for the program (SET) voltage is initialized. Tables I-III provide several examples for VD_low. Step 1402 may include determining the state to which the memory cell 108 is to be SET. The initial value for the program (SET) voltage depends on the state, in one embodiment. For example, the value from Table I could be used when the memory cell 108 is to be SET to state 1, in order to program the data into the memory cell 108. For example, the value from Table II could be used when the memory cell 108 is to be SET to state 2, in order to program the data into the memory cell 108. For example, the value from Table III could be used when the memory cell 108 is to be SET to state 3, in order to program the data into the memory cell 108.

In step 1404, programming conditions are applied to the memory cell 108. Suitable values are depicted in Tables I-III. Their selection can be as described for the selection of VD_low. Those values are just examples, however. In one embodiment, step 1404 includes applying a gate-to-source voltage to the transistor 106 in the memory cell unit 100. The source line 112 may be grounded, and Vg applied to a word line connected to the gate to achieve the gate-to-source voltage. This may limit the current through the memory cell 108 being SET. For example, when the resistance of the memory cell 108 drops, the current will increase. The transistor 106 can limit the magnitude of this current to prevent the memory cell 108 from being over-set. That is, it can prevent the resistance from dropping lower than desired.

After Vg has been established, a SET signal may be applied to a selected bit line 116 connected to memory cell 108, which has a reversible resistance storage element 102. The SET signal may be a voltage, such as a voltage pulse. Thus, the transistor 106 may limit a current of the reversible resistance storage element 102 that results from applying the SET voltage to the selected bit line 116. The timing of applying the programming conditions may be similar to that depicted in FIG. 10, with suitable values for Vg, VD, and Tpulse.

In step 1406, the memory cell 108 is read. Example read conditions are as follows. The bit line associated with the memory cell 108 being read may be set to 1.5V (or another suitable read voltage). The source line may be grounded. The gate of the transistor 106 in the memory unit 100 having the memory cell 108 being read may be set to 4.5V. The body of the transistor 106 may be grounded. In one embodiment, sensing the memory cell 108 is achieved by sensing a current of the source node of the transistor 106.

In step 1408, the memory cell current is compared to a reference current I_ver_low. This reference current tests for the lower end of the data state, referring to the example distributions in FIG. 11B. Recall that SET is used to increase the current (or decrease the resistance) of the memory cell 108. If the memory cell 108 has reached the target current (step 1408=yes), then Option A is that the SET operation is done.

As one alternative, Option B can be taken to determine whether the memory cell has been over-set. For example, if the cell was intended to be SET to state 2, it may be that the cell's current reached that of state 3. For Option B, the process continues to step 1410 to determine whether the memory cell 108 has been over-set. That is, the memory cell current is compared to I_Ver_High. If the memory cell current is less than I_Ver_High (step 1410=yes), then the memory cell's current is within the target range and the process completes.

However, if the memory cell current is greater than I_Ver_High (step 1410=no), then the memory cell has been over-set. In other words, its current is higher than desired for the target state. Another way of saying this is that the resistance is lower than desired for the target state. In this case, the process goes to "D" to perform a RESET to the target state. An example RESET process is shown and described with respect to FIG. 15. Note that "D" is an entry point to step 1502 of FIG. 15.

Returning again to the discussion of step 1408, if the memory cell current is not greater than I_Ver_Low, then the process continues on to step 1414. This covers the case in which the memory cell 108 has not yet been SET. In step 1414, the program (SET) voltage and or Vgs is increased. As noted in Tables I-III, an example increment for the program (SET) voltage is 0.5V. However, a different increment could be used. In one embodiment, Vgs is increased by a small amount, but the program (SET) voltage is not changed. In one embodiment, Vgs is increased by a small amount and the program (SET) voltage is also increased.

In step 1416, a determination is made whether the maximum SET voltage has been exceeded. If so then the process goes to step 1418. Step 1418 has the option to mark the memory cell 108 as having failed SET, or to attempt to retry SET.

Assuming that the maximum SET voltage has not been exceeded (step 1416=no), then the process returns to step 1404 to apply the programming conditions to the memory cell 108 again.

Figure 15:
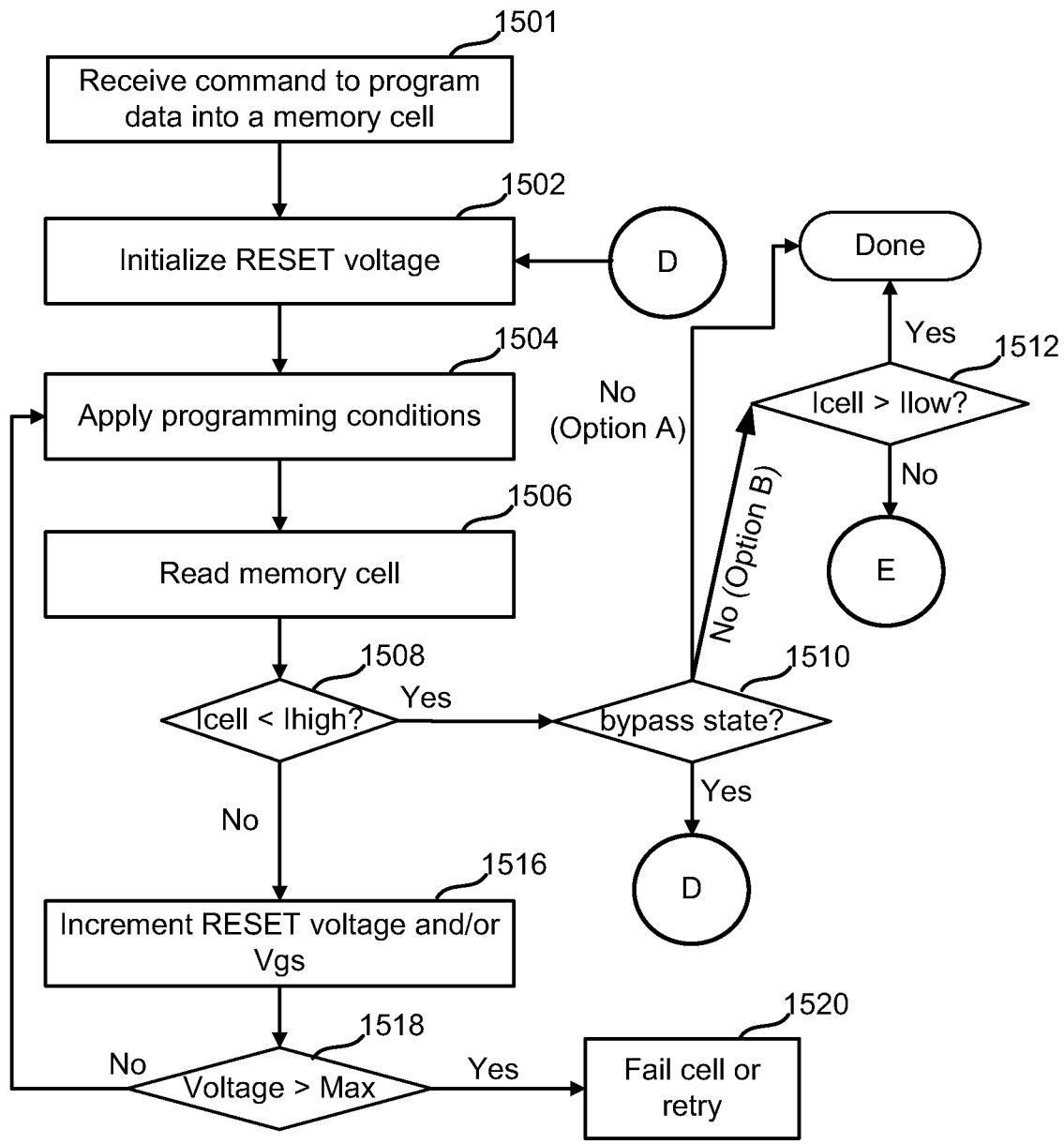
FIG. 15 provides further details for RESETTING a memory cell, in accordance with one embodiment.

FIG. 15 provides further details for RESETTING a memory cell 108, in accordance with one embodiment. The process can be used for any of steps 1302, 1304, or 1306 from FIG. 13. In step 1501, a command is received to program data into a memory cell 108. In one embodiment, the host 31 sends a request to the controller 25 to store data in the memory cell array 300 to initiate the data storage process. The controller 25 may send one or more commands and/or data on to other circuitry such as the decoder/driver 37 to cause the data to be stored in the memory cell array 300. In one embodiment, a determination is made of the present state of the memory cell 108, such that it is determined that the memory cell 108 is to be RESET in order to program the data into the memory cell 108. Step 1501 may include determining the state to which the memory cell 108 is to be RESET.

In step 1502, the initial value for the program (RESET) voltage is initialized. This may be based on the present state of the memory cell 108. For example, if the memory cell 108 is to be RESET from state 3 to state 1 in order to program the data into it, the first step may be to lower its resistance to state 2, using one group of RESET conditions. After its resistance has been lowered to state 2, then another group of RESET conditions may be used. Thus, step 1502 may include determining the present state of the memory cell 108, if not already known.

Tables IV-VI provide several examples for VD_low for RESET. A suitable table may be selected based on the present state of the memory cell 108. For example, the value from Table IV could be used when the memory cell 108 is to be RESET from state 3. For example, the value from Table V could be used when the memory cell 108 is to be RESET from state 2. For example, the value from Table VI could be used when the memory cell 108 is to be RESET from state 1. Note that in these examples, the final state to which the memory cell 108 is being RESET could be one state below the present state, or more than one state below the present state.

In step 1504, programming conditions are applied to the memory cell 108. Suitable values are depicted in Tables IV-VI. The Table selection can be as described in step 1502. These values are just examples, however. In one embodiment, step 1504 includes applying a gate-to-source voltage to the transistor 106 in the memory cell unit 100. The source line 112 may be grounded, and Vg applied to a word line connected to the gate to achieve the gate-to-source voltage. This may limit the current through the memory cell 108 being RESET. After Vg has been established, a RESET signal may be applied to a selected bit line 116 connected to memory cell 108, which has a reversible resistance storage element 102. The RESET signal may be a voltage, such as a voltage pulse. Thus, the transistor 106 may limit a current of the reversible resistance storage element 102 that results from applying the RESET voltage to the selected bit line 116. The timing of applying the RESET programming conditions may be similar to that depicted in FIG. 10, with suitable values for Vg, VD, and Tpulse.

In step 1506, the memory cell 108 is read. Example read conditions are as follows. The bit line associated with the memory cell 108 being read may be reset to 1.5V (or another suitable read voltage). The source line may be grounded. The gate of the transistor 106 in the memory unit 100 having the memory cell 108 being read may be reset to 4.5V. The body of the transistor 106 may be grounded. In one embodiment, sensing the memory cell 108 is achieved by sensing a current of the source node of the transistor 106.

In step 1508, the memory cell current is compared to a reference current I_Ver_High. This reference current may test for a point near the upper end of the data state, referring to the example distributions in FIG. 11C. Recall that RESET is used to decrease the current (or increase the resistance) of the memory cell 108.

If the memory cell 108 has reached the target I_high current (step 1508=yes), then the process may continue to step 1510 to determine whether the state associated with I_high is to be bypassed. For example if the memory cell 108 is to be RESET from state 3 to state 1 (or state 0), then state 2 can be bypassed. In this case, the process returns to step 1502. However, this time the program conditions will be for RESETTING from the next lower state. For example, the first time values from Table IV might have been used to RESET from state 3. The second time values from Table V might be used to RESET from state 2.

On the other hand this could be the final destination state. That is, this could be that state needed to program the data that was received in step 1501. In other words, the state associated with I_high is the state to which the memory cell 108 is to be RESET to program the data. In this case (step 1510=no), then Option A is for the process to conclude.

Option B is to test for a "deep-reset" case. For Option B, the process continues to step 1512 to test the memory cell current with I_low. This step tests for whether the memory cell 108 has been deep-reset. For example, the memory cell current is compared to I_Ver_Low. If the memory cell current is greater than I_Ver_Low (step 1512=yes), then the memory cell's current is within the target range for the destination state and the process completes.

However, if the memory cell current is less than I_Ver_Low (step 1512=no), then the memory cell has been deep-reset. In other words, its current is lower than desired for the target state. Another way of saying this is that the resistance is higher than desired for the target state. In this case, the process goes to "E" to perform a SET to the target state. The point "E" is an entry to step 1402 in the example SET process shown and described with respect to FIG. 14. A suitable Table I-III may be selected for SET programming conditions based on the state to which the memory cell 108 is to be programmed. As noted herein, the Tables I-III are non-limiting examples.

Note that for some states, the process can end after step 1508. For example, when RESETTING to state 0, the process can end once it is determined that Icell is less than I_Ver_High. Thus, steps 1510 and beyond may be skipped for state 0.

Returning again to the discussion of step 1508, if the memory cell current is not less than I_Ver_High, then the process continues on to step 1516. This covers the case in which the memory cell 108 has not yet been RESET. In step 1516, the program (RESET) voltage and/or Vgs is increased. As noted in Tables IV-VI, an example increment for the program (RESET) voltage is 0.2V. However, a different increment could be used. In one embodiment, Vgs is increased by a small amount, but the program (RESET) voltage is not changed. In one embodiment, Vgs is increased by a small amount and the program (RESET) voltage is also increased.

In step 1518, a determination is made whether the maximum RESET voltage has been exceeded. If so, then the process may go to step 1520. Step 1520 has the option to mark the memory cell 108 as having failed RESET, or to attempt to retry RESET.

Assuming that the maximum RESET voltage has not been exceeded (step 1518=no), then the process returns to step 1504 to apply the programming conditions to the memory cell 108 again. This concludes the discussion of FIG. 15.

One embodiment disclosed herein includes a memory array comprising a plurality of non-volatile memory cell units. Each of the memory cell units comprises a non-volatile memory cell having a first end and a second end. The memory cell comprises a reversible resistance storage element, and a non-linear element in series with the reversible resistance storage element. Each of the memory cell units also comprises a transistor having a drain, a gate, and a source. The drain of the transistor is connected to the first end of the memory cell. The memory array also comprises a common source line, a plurality of word lines, and a plurality of bit lines. The source of the transistor is connected to the common source line. The gate of the transistor is connected to a first word line of the plurality of word lines. A first bit line of the plurality of bit lines connected to the second end of the memory cell.

One embodiment disclosed herein includes a memory array comprising a plurality of memory cell units. Each of the memory cell units comprises a non-volatile memory cell having a first end and a second end. The memory cell comprises a reversible resistance storage element and a non-linear element in series with the reversible resistance storage element. The memory cell unit also includes a field effect transistor (FET), having a drain, a gate, and a source. The drain of the FET is connected to the first end of the memory cell. The gate of a first FET in a first memory cell unit of the plurality of memory cell units is connected to the gate of a second FET in a second memory cell unit of the plurality of memory cell units. The source of the first FET is connected to the source of the second FET. The first FET and the second FET are either both pMOS devices or both nMOS devices.

One embodiment disclosed herein includes a memory array comprising a plurality of memory cell units. Each of the memory cell units comprises a plurality of non-volatile memory cells each having a first end and a second end. Each non-volatile memory cell comprises a reversible resistance storage element and a non-linear element in series with the reversible resistance storage element. The memory cell unit further includes a field effect transistor (FET) having a drain, a gate, and a source. The drain of the FET connected to the first end of each of the memory cells in the memory cell unit. The memory array further comprises a common source line, a plurality of word lines, and a plurality of bit lines. The source of each FET in each of the memory cell units connects to the common source line. A first group of the plurality of memory cell units is associated with a first word line of the word lines. A second group of the plurality of memory cell units is associated with a second word line of the word lines. The gates of the FETs of the memory cell units in the first group is connected to the first word line. The gates of the FETs of the memory cell units in the second group is connected to the second word line. The second end of each of the plurality of memory cells is connected to a bit line of the plurality of bit lines.

One embodiment disclosed herein includes a method of operating a non-volatile storage device. The method comprises training a reversible resistance storage element and programming the reversible resistance storage element between a lower resistance data state and a higher resistance data state after training the reversible resistance storage element. The training includes applying a first gate-to-source voltage (Vgs) to a transistor that is connected in series to the reversible resistance storage element while applying a training signal to the reversible resistance storage element. The transistor limits a current of the reversible resistance storage element in response to the training signal. The programming includes applying a second gate-to-source voltage to the transistor that is less than the first gate-to-source voltage while applying a programming signal to the reversible resistance storage element. The transistor limits a current of the reversible resistance storage element in response to the programming signal.

One embodiment disclosed herein includes a method of operating a non-volatile storage device. The method comprises programming memory cells having reversible resistance storage elements to a first data state, a second data state, a third data state, and a fourth data state having progressively lower resistances. The programming including skipping a data state when SETTING a first of the reversible resistance storage elements from its current data state to a data state at least two data states away.

In one embodiment, the skipping a data state when programming the resistance state change storage element comprises applying a first set of programming conditions for SETTING from the current data state to the immediate next data state, applying a second set of programming conditions for SETTING from the immediate next data state to the data state two states away from the current data state, and applying the second set of programming conditions for SETTING directly from the current data state to the data state two states away from the current data state.

One embodiment disclosed herein includes a method of operating a non-volatile storage device. The non-volatile storage device comprise a plurality of non-volatile memory cell units. Each of the memory cell units comprises a non-volatile storage cell and a transistor. The non-volatile storage cell has a first end and a second end. The non-volatile storage cell comprises a reversible resistance storage element and a non-linear element in series with the reversible resistance storage element. The transistor has a drain, a gate, and a source. The drain of the transistor is connected to the first end of the storage cell. The non-volatile storage device further comprises a common source line, a plurality of word lines, and plurality of bit lines. The source of the transistor is connected to the common source line. The gate of the transistor is connected to a first word line of the plurality of word lines. A first bit line of the plurality of bit lines is connected to the second end of the storage cell. The method comprises training the non-volatile storage cells. The training includes applying a first gate-to-source voltage to the transistors associated with the non-volatile storage cells while applying a training voltage to the bit lines associated with the non-volatile storage cells. The transistors limit a current of the non-volatile memory cells in response to the training voltage. The method further includes programming the plurality of non-volatile storage cells to multiple bits per storage cell after training the non-volatile storage cells. The programming includes applying a second gate-to-source voltage to the transistors that is less than the first gate-to-source voltage while applying a programming voltage to the bit lines associated with the non-volatile storage cells. The transistors limit a current of the non-volatile storage cells in response to the programming voltage.

The foregoing detailed description has been presented for purposes of illustration and description. It is not intended to be exhaustive or limiting to the precise form disclosed. Many modifications and variations are possible in light of the above teaching. The described embodiments were chosen in order to best explain the principles of the disclosed technology and its practical application, to thereby enable others skilled in the art to best utilize the technology in various embodiments and with various modifications as are suited to the particular use contemplated. It is intended that the scope be defined by the claims appended hereto.

What is claimed is:

1. A method of operating a non-volatile storage device, the method comprising:
   programming memory cells having reversible resistance storage elements to a first data state, a second data state, a third data state, and a fourth data state having progressively lower resistances, including skipping a data state when SETTING a first of the reversible resistance storage elements from its current data state to a data state at least two data states away, the skipping comprising:
   i) applying a first set of programming conditions for SETTING from the current data state to the immediate next data state;
   ii) applying a second set of programming conditions for SETTING from the immediate next data state to the data state two states away from the current data state; and
   iii) applying the second set of programming conditions for SETTING directly from the current data state to the data state two states away from the current data state.

2. The method of claim 1, wherein applying the first set of programming conditions comprises applying a SET voltage having a first pulse width, wherein applying the second set of programming conditions comprises applying a SET voltage having a second pulse width, wherein the first and second pulse widths are different.

3. The method of claim 2, wherein the second pulse width is longer than the first pulse width.

4. The method of claim 1, wherein applying the first set of programming conditions comprises applying an initial SET voltage having a first pulse magnitude, wherein applying the second set of programming conditions comprises applying an initial SET voltage having a second pulse magnitude, wherein the first and second pulse magnitudes are different.

5. The method of claim 4, wherein the second pulse magnitude is greater than the first pulse magnitude.

6. The method of claim 1, wherein applying the first set of programming conditions comprises applying an initial SET voltage having a first energy level, wherein applying the second set of programming conditions comprises applying an initial SET voltage having a second energy level, wherein the second energy level is greater than the first energy level.

7. The method of claim 1, wherein the skipping a data state when SETTING the resistance state change storage element further comprises:
applying a third set of programming conditions for SETTING from the data state two states away from the current data state to the data state three states away from the current data state, and applying the third set of programming conditions for SETTING directly from the current data state to the data state three states away from the current data state.

8. The method of claim 1, wherein the skipping a data state includes applying programming conditions that are dependent on the data state to which the reversible resistance storage element is being SET.

9. The method of claim 1, wherein the first reversible resistance storage element is within a first memory cell that includes a first non-linear element, wherein the first memory cell is included in a first memory cell unit having a first transistor that controls current through the first memory cell, wherein a first end of the first memory cell is connected to a bit line, wherein a second end of the first memory cell is connected to the first transistor, wherein the skipping a data state when SETTING the first reversible resistance storage element from its current data state to a data state at least two data states away comprises:
applying a SET voltage to the bit line while applying a gate-to-source voltage to the first transistor, wherein the first transistor limits a current of the reversible resistance storage element that results from applying the SET voltage to the bit line.

10. The method of claim 1, wherein the skipping a data state when SETTING a first of the reversible resistance storage elements from its current data state to a data state at least two data states away comprises:
testing for a first verify current associated with the data state at least two data states away without testing for a second verify current associated with the immediate next data state to the current data state.

11. A non-volatile storage device comprising:
a monolithic three dimensional memory array comprising memory cells having reversible resistance storage elements; and
a circuit in communication with the monolithic three dimensional memory array, wherein the circuit is configured to program the memory cells to a first data state, a second data state, a third data state, and a fourth data state having progressively lower resistances, wherein the circuit is configured to skip a data state when SETTING a first of the reversible resistance storage elements from its present data state to a data state at least two data states away, wherein the data state at least two data states away has a lower resistance than the present data state, to skip the data state when programming the resistance state change storage element the circuit is configured to apply a first set of programming conditions for SETTING from the present data state to the data state with the next lowest resistance, apply a second set of programming conditions for SETTING from the data state with the next lowest resistance to the data state two states away from the present data state, and apply the second set of programming conditions for SETTING directly from the present data state to the data state two states away from the present data state.

12. The non-volatile storage device of claim 11, wherein the circuit being configured to apply the first set of programming conditions comprises the circuit being configured to apply a SET voltage having a first pulse width, wherein the circuit being configured to apply the second set of programming conditions comprises the circuit being configured to apply a SET voltage having a second pulse width, wherein the second pulse width is longer than the first pulse width.

13. The non-volatile storage device of claim 11, wherein the circuit being configured to apply the first set of programming conditions comprises the circuit being configured to apply a SET voltage having a first pulse magnitude, wherein the circuit being configured to apply the second set of programming conditions comprises the circuit being configured to apply a SET voltage having a second pulse magnitude, wherein the second pulse magnitude is greater than the first pulse magnitude.

14. The non-volatile storage device of claim 11, wherein the circuit being configured to apply the first set of programming conditions comprises the circuit being configured to apply an initial SET voltage having a first energy level, wherein the circuit being configured to apply the second set of programming conditions comprises the circuit being configured to apply an initial SET voltage having a second energy level, wherein the second energy level is greater than the first energy level.

15. The non-volatile storage device of claim 11, wherein the circuit being configured to skip a data state when SETTING the resistance state change storage element further comprises the circuit being configured to:
apply a third set of programming conditions for SETTING from the data state two states away from the present data state to the data state three states away from the present data state, and apply the third set of programming conditions for SETTING directly from the present data state to the data state three states away from the present data state.

16. The non-volatile storage device of claim 11, wherein the circuit being configured to skip a data state includes the circuit being configured to apply programming conditions that are dependent on the data state to which the reversible resistance storage element is being SET.

17. The non-volatile storage device of claim 11, further comprising:
a plurality of bit lines associated with the memory cells;
wherein the memory cells each include a non-linear element in series with one of the reversible resistance storage elements, wherein each of the memory cells is included in a memory cell unit having a transistor that controls current through the memory cell, wherein a first end of each of the memory cells is connected to one of the bit lines, wherein a second end of each of the memory cells is connected to the transistor of one of the memory cell units;
wherein the circuit being configured to skip a data state when SETTING the first reversible resistance storage element from its present data state to a data state at least two data states away comprises the circuit being configured to apply a SET voltage to a first of the bit lines while applying a gate-to-source voltage to the transistor of the memory cell unit associated with the first reversible resistance storage element, wherein the gate-to-source voltage applied to the transistor limits the current through the first reversible resistance storage element.

18. A non-volatile storage device comprising:
a three dimensional memory array comprising memory cells each having a reversible resistance storage element and a non-linear element in series with the reversible resistance storage element; and a circuit in communication with the three dimensional memory array, wherein the circuit programs the memory cells to a first current distribution associated with a first data state, a second current distribution associated with a second data state, a third current distribution associated with a third data state, and a fourth current distribution associated with a fourth data state, wherein each of the current distributions is associated with a range of currents, wherein the circuit receives a command to program data into a first of the memory cells having a first of the reversible resistance storage elements, wherein the circuit determines a present data state of the first memory cell, wherein the circuit determines programming conditions for programming the first memory cell from the present state to the data state associated with the data to be programmed into the first memory cell, wherein the circuit skips a current distribution when programming the data into the first memory cell, the programming includes moving the first memory cell to a current distribution having a higher range of currents, wherein to skip the current distribution when programming the data into the first memory cell the circuit tests for a first verify current associated with the data state at least two data states away without testing for a second verify current associated with the immediate next data state to the present data state.

19. The non-volatile storage device of claim 18, wherein to skip the current distribution when programming the data into the first memory cell the circuit to applies a first set of programming conditions for SETTING from the present data state to the data state with the next highest current distribution, applies a second set of programming conditions for SETTING from the data state with the next highest current distribution to the data state two states away from the present data state, and apply the second set of programming conditions for SETTING directly from the present data state to the data state two states away from the present data state.

20. A method of operating a non-volatile storage device, the method comprising:

programming memory cells having reversible resistance storage elements to a first data state, a second data state, a third data state, and a fourth data state having progressively lower resistances, including skipping a data state when SETTING a first of the reversible resistance storage elements from its current data state to a data state at least two data states away, wherein the skipping a data state when SETTING a first of the reversible resistance storage elements from its current data state to a data state at least two data states away comprises testing for a first verify current associated with the data state at least two data states away without testing for a second verify current associated with the immediate next data state to the current data state.

21. A non-volatile storage device comprising:
a plurality of bit lines;
a three dimensional memory array comprising memory cells having reversible resistance storage elements, the memory cells each including a non-linear element in series with one of the reversible resistance storage elements, each of the memory cells being included in a memory cell unit having a transistor that controls current through the memory cell, a first end of each of the memory cells being connected to a first bit line of the plurality of bit lines, a second end of each of the memory cells being connected to the transistor of a first memory cell unit of the memory cell units; and a circuit in communication with the three dimensional memory array, the circuit being configured to program the memory cells to a first data state, a second data state, a third data state, and a fourth data state having progressively lower resistances, the circuit being configured to skip a data state when SETTING a first of the reversible resistance storage elements from its present data state to a data state at least two data states away, the data state at least two data states away having a lower resistance than the present data state;

the circuit being configured to skip a data state when SETTING the first reversible resistance storage element from its present data state to a data state at least two data states away comprises the circuit being configured to apply a SET voltage to a first of the bit lines while applying a gate-to-source voltage to the transistor of the memory cell unit associated with the first reversible resistance storage element, the gate-to-source voltage applied to the transistor limits the current through the first reversible resistance storage element.

22. A non-volatile storage device comprising:
a three dimensional memory array comprising memory cells having reversible resistance storage elements; and
programming means for programming the memory cells to a first data state, a second data state, a third data state, and a fourth data state having progressively lower resistances, the programming means having skipping means for skipping a data state when SETTING a first of the reversible resistance storage elements from its current data state to a data state at least two data states away, the skipping means comprising:

i) means for applying a first set of programming conditions for SETTING from the current data state to the immediate next data state;

ii) means for applying a second set of programming conditions for SETTING from the immediate next data state to the data state two states away from the current data state; and iii) means for applying the second set of programming conditions for SETTING directly from the current data state to the data state two states away from the current data state.

* * * * *